US009935124B2

(12) United States Patent
Nishikawa et al.

(10) Patent No.: US 9,935,124 B2
(45) Date of Patent: Apr. 3, 2018

(54) SPLIT MEMORY CELLS WITH UNSPLIT SELECT GATES IN A THREE-DIMENSIONAL MEMORY DEVICE

(71) Applicant: SANDISK TECHNOLOGIES LLC, Plano, TX (US)

(72) Inventors: Masatoshi Nishikawa, Yakkaichi (JP); Masafumi Miyamoto, Yokkaichi (JP); Hiroyuki Ogawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/219,719

(22) Filed: Jul. 26, 2016

(65) Prior Publication Data

US 2017/0148809 A1    May 25, 2017

Related U.S. Application Data

(60) Provisional application No. 62/259,750, filed on Nov. 25, 2015.

(51) Int. Cl.
*H01L 27/115* (2017.01)
*H01L 27/11582* (2017.01)
(Continued)

(52) U.S. Cl.
CPC .. *H01L 27/11582* (2013.01); *H01L 21/28273* (2013.01); *H01L 21/28282* (2013.01);
(Continued)

(58) Field of Classification Search
CPC ........... H01L 27/11578; H01L 27/1158; H01L 27/11582; H01L 27/11517;
(Continued)

(56) References Cited

U.S. PATENT DOCUMENTS 5,915,167 A    6/1999    Leedy
7,575,973 B2   8/2009    Mokhlesi et al.
(Continued)

OTHER PUBLICATIONS

Invitation to Pay Additional Fees and Communication Relating to the Results of the Partial International Search from the International Searching Authority for PCT/US2016/050427, dated Nov. 23, 2016, 9 pages.

(Continued)

*Primary Examiner* — Matthew Landau
*Assistant Examiner* — Scott Stowe
(74) *Attorney, Agent, or Firm* — The Marbury Law Group PLLC

(57) ABSTRACT

Split memory cells can be provided within an alternating stack of insulating layers and word lines. At least one lower-select-gate-level electrically conductive layers and/or at least one upper-select-level electrically conductive layers without a split memory cell configuration can be provided by limiting the levels of separator insulator structures within the levels of the word lines. At least one etch stop layer can be formed above at least one lower-select-gate-level spacer material layer. An alternating stack of insulating layers and spacer material layers is formed over the at least one etch stop layer. Separator insulator structures are formed through the alternating stack employing the etch stop layer as a stopping structure. Upper-select-level spacer material layers can be subsequently formed. The spacer material layers and the select level material layers are formed as, or replaced with, electrically conductive layers.

22 Claims, 22 Drawing Sheets

(51) Int. Cl.
| | |
|---|---|
| *H01L 23/528* | (2006.01) |
| *H01L 27/11556* | (2017.01) |
| *H01L 29/06* | (2006.01) |
| *H01L 21/28* | (2006.01) |
| *H01L 21/311* | (2006.01) |
| *H01L 23/522* | (2006.01) |
| *H01L 27/11519* | (2017.01) |
| *H01L 27/11521* | (2017.01) |
| *H01L 27/11526* | (2017.01) |
| *H01L 27/11565* | (2017.01) |
| *H01L 27/11568* | (2017.01) |
| *H01L 27/11573* | (2017.01) |
| *H01L 29/08* | (2006.01) |
| *H01L 27/1157* | (2017.01) |

(52) U.S. Cl.
CPC ...... *H01L 21/31111* (2013.01); *H01L 23/528* (2013.01); *H01L 23/5226* (2013.01); *H01L 27/1157* (2013.01); *H01L 27/11519* (2013.01); *H01L 27/11521* (2013.01); *H01L 27/11526* (2013.01); *H01L 27/11556* (2013.01); *H01L 27/11565* (2013.01); *H01L 27/11568* (2013.01); *H01L 27/11573* (2013.01); *H01L 29/0649* (2013.01); *H01L 29/0847* (2013.01)

(58) Field of Classification Search
CPC ......... H01L 27/11519; H01L 27/11551; H01L 27/11556; H01L 27/11565; H01L 21/28282; H01L 21/28273
See application file for complete search history.

(56) References Cited

U.S. PATENT DOCUMENTS

| | | | |
|---|---|---|---|
| 7,906,392 | B2 | 3/2011 | Dunton et al. |
| 8,084,819 | B2 | 12/2011 | Kim et al. |
| 8,187,936 | B2 | 5/2012 | Alsmeier et al. |
| 8,461,641 | B2 | 6/2013 | Alsmeier et al. |
| 8,610,194 | B2 | 12/2013 | Aritome |
| 8,735,962 | B2 | 5/2014 | Whang et al. |
| 8,767,465 | B2 | 7/2014 | Chang et al. |
| 8,823,076 | B2 | 9/2014 | Lee et al. |
| 8,853,765 | B2 | 10/2014 | Lee et al. |
| 8,981,457 | B2 | 3/2015 | Lee et al. |
| 8,987,119 | B2 | 3/2015 | Dunton et al. |
| 9,023,719 | B2 | 5/2015 | Pachamuthu et al. |
| 2007/0029607 | A1 | 2/2007 | Kouznetzov |
| 2007/0252201 | A1* | 11/2007 | Kito ............... H01L 21/8221 257/331 |
| 2009/0146206 | A1 | 6/2009 | Fukuzumi et al. |
| 2009/0230454 | A1 | 9/2009 | Pekny |
| 2010/0207194 | A1* | 8/2010 | Tanaka ............. H01L 27/11578 257/324 |
| 2010/0213527 | A1 | 8/2010 | Shim et al. |
| 2011/0057251 | A1 | 3/2011 | Higashi |
| 2011/0156044 | A1 | 6/2011 | Lee et al. |
| 2011/0287612 | A1 | 11/2011 | Lee et al. |
| 2011/0309432 | A1 | 12/2011 | Ishihara et al. |
| 2012/0012921 | A1 | 1/2012 | Liu |
| 2012/0267699 | A1 | 10/2012 | Kiyotoshi |
| 2012/0326221 | A1 | 12/2012 | Sinha |
| 2013/0044531 | A1 | 2/2013 | Baek et al. |
| 2014/0131784 | A1 | 5/2014 | Davis et al. |
| 2015/0044833 | A1 | 2/2015 | Lee et al. |
| 2015/0076584 | A1 | 3/2015 | Pachamuthu et al. |
| 2015/0179660 | A1 | 6/2015 | Yada et al. |
| 2015/0255481 | A1 | 9/2015 | Baenninger et al. |
| 2015/0287710 | A1 | 10/2015 | Yun et al. |
| 2015/0371709 | A1 | 12/2015 | Kai et al. |
| 2016/0071860 | A1 | 3/2016 | Kai et al. |
| 2016/0071861 | A1 | 3/2016 | Serov et al. |
| 2016/0071876 | A1 | 3/2016 | Mizuno et al. |
| 2016/0133642 | A1 | 5/2016 | Jeon et al. |

OTHER PUBLICATIONS

International Search Report and Written Opinion of the International Search Authority for International Application No. PCT/US2016/050427, dated Jan. 17, 2017, 17 pages.
International Search Report and Written Opinion of the International Search Authority for International Application No. PCT/US2016/050432, dated Jan. 31, 2017, 16 pages.
USPTO Non Final Office Action for U.S. Appl. No. 15/219,652, dated Jun. 5, 2017, 12 pages.
International Preliminary Report on Patentability and Written Opinion of the International Searching Authority for International Application No. PCT/IB2015/053094 dated Nov. 10, 2016, 11 pages.
Office Communication for U.S. Appl. No. 14/748,670, 21 pages, dated Jul. 15, 2016.
International Search Report and Written Opinion for PCT/US2015/055559, dated Apr. 7, 2016, 19 pages.
Invitation to Pay Additional Fees and Communication Relating to the Results of the Partial International Search for PCT/US2015/055559, 10 pages, dated Jan. 26, 2016.
International Searching Report and Written Opinion of the International Searching Authority for PCT/US2015/042220, 24 pages, dated Jan. 18, 2016.
Office Communication for U.S. Appl. No. 14/748,575, 20 pages, dated Jul. 15, 2016.
Invitation to Pay Additional Fees and Annex to Form PCT/ISA/206 Communication Relating to Results of the Partial International Search for PCT/US2015/042220, dated Oct. 13, 2015.
U.S. Appl. No. 14/317,274, filed Jun. 27, 2014, SanDisk Technologies Inc.
U.S. Appl. No. 15/219,652, filed Jul. 26, 2016, SanDisk Technologies Inc.
Invitation to Pay Additional Fees from the International Searching Authority for International Patent Application No. PCT/US2016/050432, dated Dec. 5, 2016, 8 pages.

* cited by examiner

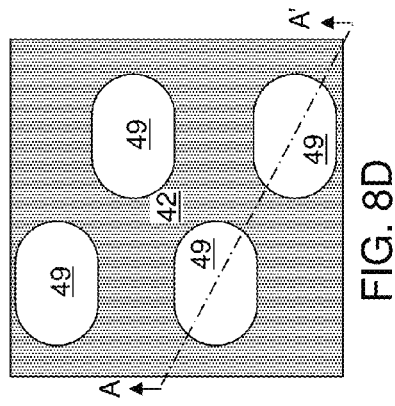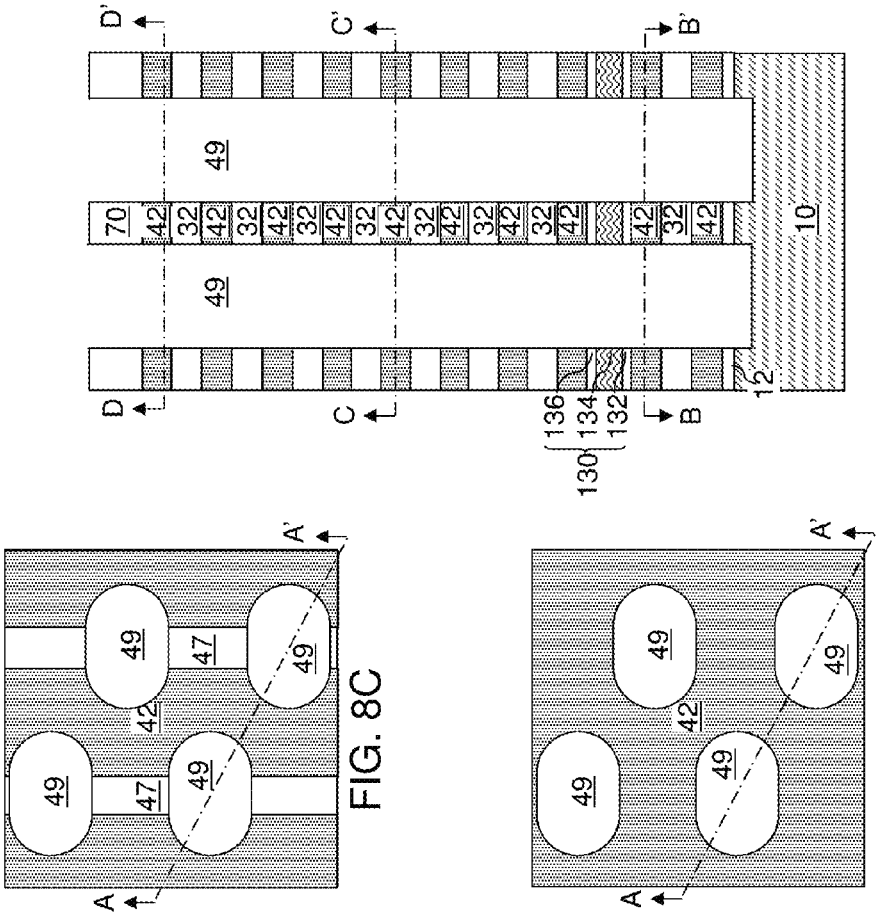

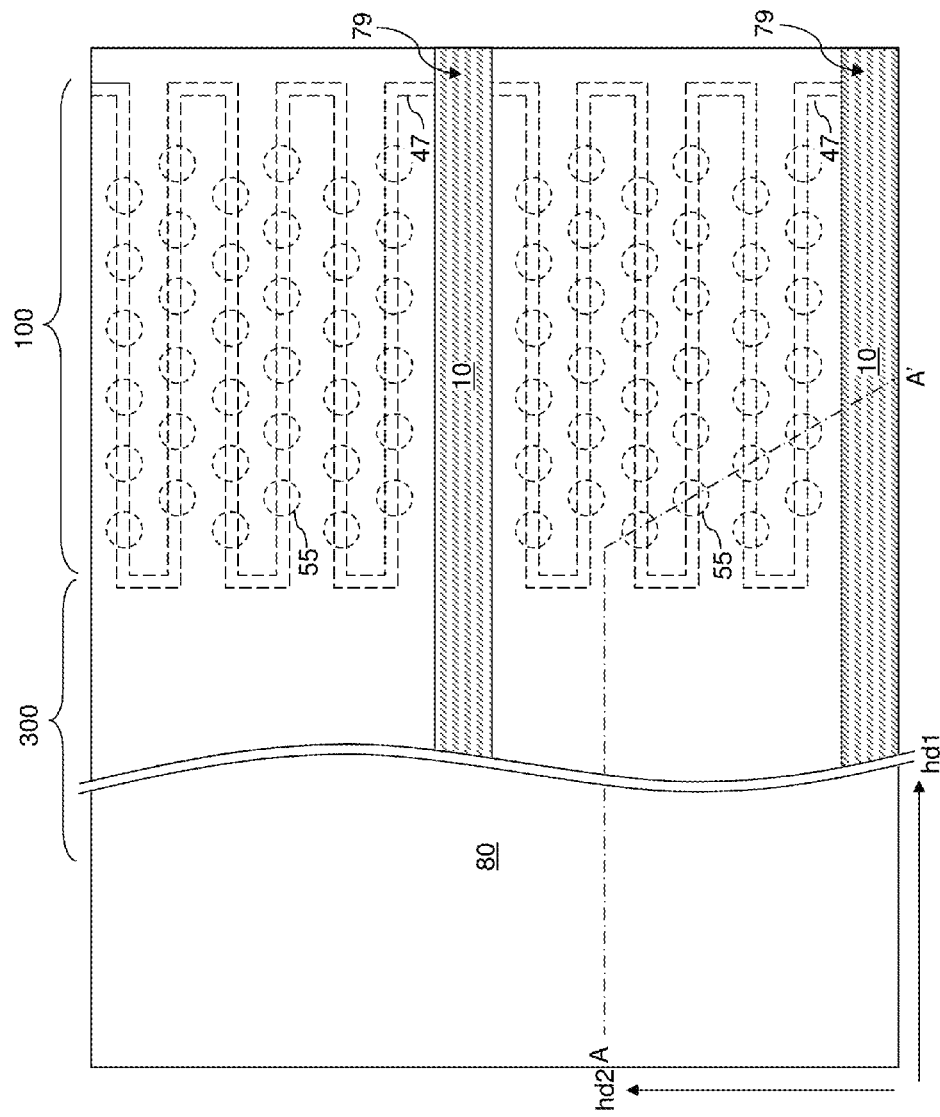

SPLIT MEMORY CELLS WITH UNSPLIT SELECT GATES IN A THREE-DIMENSIONAL MEMORY DEVICE

RELATED APPLICATIONS

This application claims the benefit of priority of U.S. Provisional Application No. 62/259,750 filed on Nov. 25, 2015, which is incorporated herein by reference in its entirety.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a three-dimensional memory device is provided, which comprises: at least one lower-select-gate-level electrically conductive layer located over a substrate; at least one etch stop layer located over the at least one lower-select-gate-level electrically conductive layer; an alternating stack of insulating layers and electrically conductive layers located over the at least one etch stop layer; memory stack structures extending through the alternating stack, the at least one etch stop layer, and the at least one lower-select-gate-level electrically conductive layer; and separator insulator structures vertically extending through the alternating stack and having respective bottommost surfaces above the at least one lower-select-gate-level electrically conductive layer and contacting sidewalls of the memory stack structures at each level of layers within the alternating stack.

According to another aspect of the present disclosure, a method of forming a three-dimensional memory device is provided. At least one lower-select-gate-level spacer material layer is formed over a substrate. At least one etch stop layer is formed over the at least one lower-select-gate-level spacer material layer. An alternating stack of insulating layers and spacer material layers is formed over the at least one etch stop layer. Separator insulator structures are formed through the alternating stack. The separator insulator structures have respective bottommost surfaces contacting at least one etch stop layer. Memory stack structures are formed through the alternating stack, the at least one etch stop layer, and the at least one lower-select-gate-level electrically conductive layer. The at least one lower-select-gate-level spacer material layer and the spacer material layers are provided as, or are replaced with, electrically conductive layers.

BRIEF DESCRIPTION OF THE DRAWINGS

FIG. 8A is a vertical cross-sectional view of the region R of the exemplary structure of FIG. 7A.

FIG. 8B is a horizontal cross-sectional view of the region R along the horizontal plane B-B' of FIG. 8A.

FIG. 8C is a horizontal cross-sectional view of the region R along the horizontal plane C-C' of FIG. 8A. FIG. 8D is a horizontal cross-sectional view of the region R along the horizontal plane D-D' of FIG. 8A.

FIG. 12B is a top-down view of the exemplary structure of FIG. 12A. The vertical plane A-A' corresponds to the plane of the vertical cross-sectional view of FIG. 12A.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
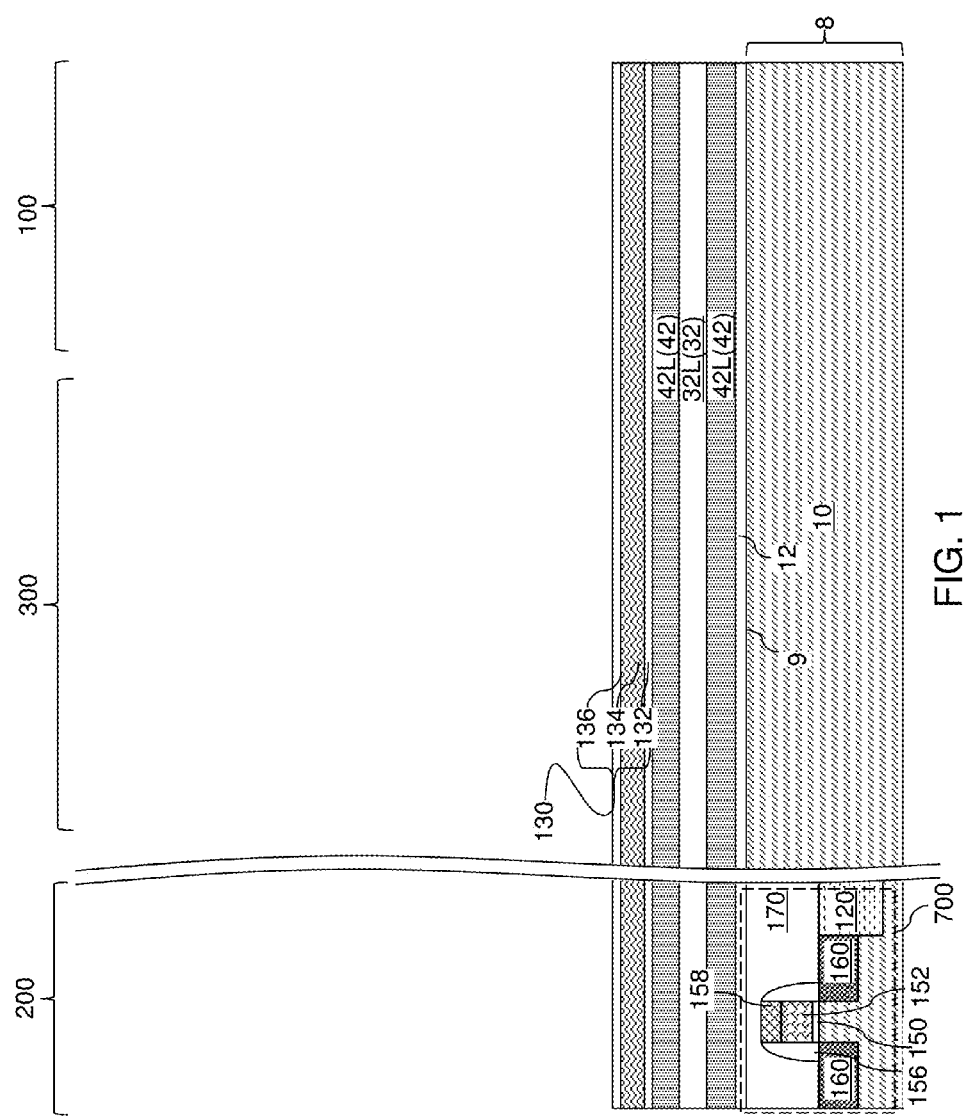
FIG. 1 is a vertical cross-section of an exemplary structure after formation of at least one lower-select-gate-level spacer material layer and a vertically-insulating layer stack of a substrate according to an embodiment of the present disclosure.

Referring to FIG. 1, an exemplary device structure according to embodiments of the present disclosure is shown, which can be employed to form a 3D NAND stacked memory device. The exemplary device structure includes a substrate 8, which can be a semiconductor substrate. Various semiconductor devices can be formed on, or over, the substrate 8 employing methods known in the art. For example, an array of memory devices can be subsequently formed in a memory array region 100, and at least one peripheral device 700 can be formed in a peripheral device region 200. Electrically conductive via contacts to the electrically conductive electrodes of devices in the memory array region 100 can be subsequently formed in a contact region 300.

The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10.

Optionally, a top surface of the semiconductor material layer 10 of the substrate can be recessed in the peripheral device region 200. Alternatively, semiconductor devices can be formed on the top surface of the semiconductor material layer 10 in the peripheral device region 200, and an epitaxial semiconductor material can be grown outside the peripheral device region to add to the material of the semiconductor material layer 10 in the memory array region 100 and the contact region 200.

Formation of semiconductor devices in the peripheral device region 200 can be performed employing various processing steps. The semiconductor devices in the peripheral device region 200 are herein referred to as peripheral devices 700. At least one optional shallow trench isolation structure 120 and/or at least one deep trench isolation structure (not shown) may be employed to provide electrical isolation among various semiconductor devices on the substrate 8. The peripheral devices 700 formed in the peripheral device region 200 can include any device known in the art and needed to support the operation of the semiconductor devices in the memory array region 100. The peripheral devices 700 can include a driver circuit associated with the array of the memory devices in the memory array region 100. The peripheral device 700 can comprise transistor devices in the driver circuit. In one embodiment, the peripheral devices can include one or more field effect transistors, each of which can include active regions 160 (which include a source region and a drain region), a body region (including a portion of the semiconductor material layer 10 located between a respective pair of a source region and a drain region), a gate stack (150, 152, 158), and a gate spacer 156. The gate stack (150, 152, 158) can include any type of gate stack structures known in the art. For example, each gate stack (150, 152, 158) can include, from bottom to top, a gate dielectric 150, a gate electrode 152, and an optional gate cap dielectric 158. Optionally, a planarization dielectric layer 170 including a dielectric material may be employed in the peripheral device region 200 to facilitate planarization of the portion of material stacks to be subsequently formed on the substrate 8. In one embodiment, the planarization dielectric layer 170 can be planarized to provide a top surface of a pre-existing semiconductor material layer 10 in case the peripheral devices 700 are formed within a recessed region of the substrate. Alternatively, the planarization dielectric layer 170 can be planarized to provide a planar top surface located above the horizontal plane including the top surface of a pre-existing semiconductor material layer 10, and an epitaxial semiconductor material can be grown from the top surface of the semiconductor material layer 10 and planarized such that the top surface the planarized semiconductor material layer 10 and the top surface of the planarization dielectric layer 170 are within a same horizontal plane.

Subsequently, a gate dielectric layer 12 and at least one lower-select-gate-level spacer material layer 42L can be formed. The gate dielectric layer 12 can include any gate dielectric material known in the art. For example, the gate dielectric layer 12 can include a silicon oxide layer, a silicon oxynitride layer, a dielectric metal oxide layer, or a stack thereof. The gate dielectric layer 12 can be formed by deposition of at least one dielectric material and/or thermal or plasma conversion of a surface portion of the semiconductor material layer 10. The thickness of the gate dielectric layer 12 can be in a range from 1 nm to 10 nm, although lesser and greater thicknesses can also be employed.

The at least one lower-select-gate-level spacer material layer 42L is a first subset of spacer material layers 42 formed over the gate dielectric layer 12 in the exemplary structure. The at least one lower-select-gate-level spacer material layer 42L can have the same composition as additional spacer material layers 42 to be subsequently formed in an alternating stack of insulating layers and spacer material layers 42. In one embodiment, the at least one lower-select-gate-level spacer material layer 42L and the additional spacer material layers 42 to be subsequently formed may be sacrificial material layers that are replaced with respective electrically conductive layers. In another embodiment, the at least one lower-select-gate-level spacer material layer 42L can have the same composition as additional spacer material layers 42, and can be formed as electrically conductive layers. For example, the at least one lower-select-gate-level spacer material layer 42L and the additional spacer material layers 42 can be metal layers each including, for example, a respective TiN liner and a respective W fill portion. While the present disclosure is described employing an embodiment in which the at least one lower-select-gate-level spacer material layer 42L and the additional spacer material layers 42 are formed as sacrificial material layers, embodiments are expressly contemplated herein in which the at least one lower-select-gate-level spacer material layer 42L and the additional spacer material layers 42 are formed as electrically conductive layers that are not subsequently replaced.

In the present disclosure, if the at least one lower-select-gate-level spacer material layer 42L is distinguished from the additional spacer material layers 42 to be subsequently formed, the at least one lower-select-gate-level spacer material layer 42L is identified as the "at least one lower-select-gate-level spacer material layer." If the at least one lower-select-gate-level spacer material layer 42L is treated as an element among the set of all spacer material layers 42 (additional subsets of which are to be subsequently formed), the at least one lower-select-gate-level spacer material layer 42L is identified as one of the "spacer material layers 42." The at least one lower-select-gate-level spacer material layer 42L is formed at a lower select gate level, which is the level at which a set of at least one lower select gate electrode is formed (as at least one electrically conductive layers), or is subsequently formed (by replacement of a respective sacrificial material layer). The at least one lower select gate electrode can be employed to select a set of vertical semiconductor channel(s) connected to a common source region.

In case the at least one lower-select-gate-level spacer material layer 42L includes a plurality of lower-select-gate-level spacer material layers 42L, a lower-select-gate-level insulating layer 32L can be provided between each vertically neighboring pair of lower-select-gate-level spacer material layers 42L. The at least one lower-select-gate-level insulating layer 32L is a first subset of insulating layers 32 formed over the gate dielectric layer 12 in the exemplary structure. The at least one lower-select-gate-level insulating layer 32L can have the same composition as additional insulating layers 32 to be subsequently formed in the alternating stack of insulating layers 32 and spacer material layers 42. In the present disclosure, if the at least one lower-select-gate-level insulating layer 32L is distinguished from the additional insulating layers 32 to be subsequently formed, the at least one lower-select-gate-level insulating layer 32L is identified as the "at least one lower-select-gate-level insulating layer." If the at least one lower-select-gate-level insulating layer 32L is treated as an element among the set of all insulating layers 32 (additional subsets of which are to be subsequently formed), the at least one lower-select-gate-level insulating layer 32L is identified as one of the "insulating layers 32." The at least one lower-select-gate-level insulating layer 32L is formed between each neighboring pair of lower select gate levels.

The at least one lower-select-gate-level spacer material layer 42L can include the same material as the additional spacer material layers 42 to be subsequently formed. The at least one insulating layer 32L, if present, can include the same material as the additional insulating layers 32 to be subsequently formed. The thickness of each of the at least one lower-select-gate-level spacer material layer 42L can be in a range from 20 nm to 50 nm, although lesser and greater thicknesses can also be employed. The thickness of each of the at least one lower-select-gate-level insulating layer 32L can be in a range from 20 nm to 50 nm, although lesser and greater thicknesses can also be employed.

At least one etch stop layer 130 is formed over the topmost layer among the at least one lower-select-gate-level spacer material layer 42. The etch stop layer can be a vertically-insulating layer stack 130 which can be formed by depositing a lower insulating layer 132 including a first insulating material over the at least one select-gate-level material layer 42L, depositing an etch stop material layer 134 over the lower insulating layer 132, and depositing an upper insulating layer 136 including a second insulating material over the etch stop material layer 134.

The lower insulating layer 132 and the upper insulating layer 136 can include a dielectric material having a different composition than the at least one lower-select-gate-level spacer material layer 42L. For example, the at least one lower-select-gate-level spacer material layer 42L can include silicon nitride or germanium, and the lower insulating layer 132 and the upper insulating layer 136 can include silicon oxide. The etch stop material layer 134 includes a material that is different from the materials of the at least one lower-select-gate-level spacer material layer 42 to be subsequently formed and the lower insulating layer 132 and the upper insulating layer 136. For example, the etch stop material layer 134 can include a silicon-containing semiconductor material (such as amorphous silicon, polysilicon, or a silicon-germanium alloy). The thickness of each of the lower insulating layer 132 and the upper insulating layer 136 can be in a range from 5 nm to 30 nm, although lesser and greater thicknesses can also be employed. The thickness of the etch stop material layer 134 can be in a range from 10 nm to 50 nm, although lesser and greater thicknesses can also be employed. The vertically-insulating layer stack 130 provides electrical insulation along the vertical direction, i.e., along the direction of the thickness of the vertically-insulating layer stack 130.

Figure 2:
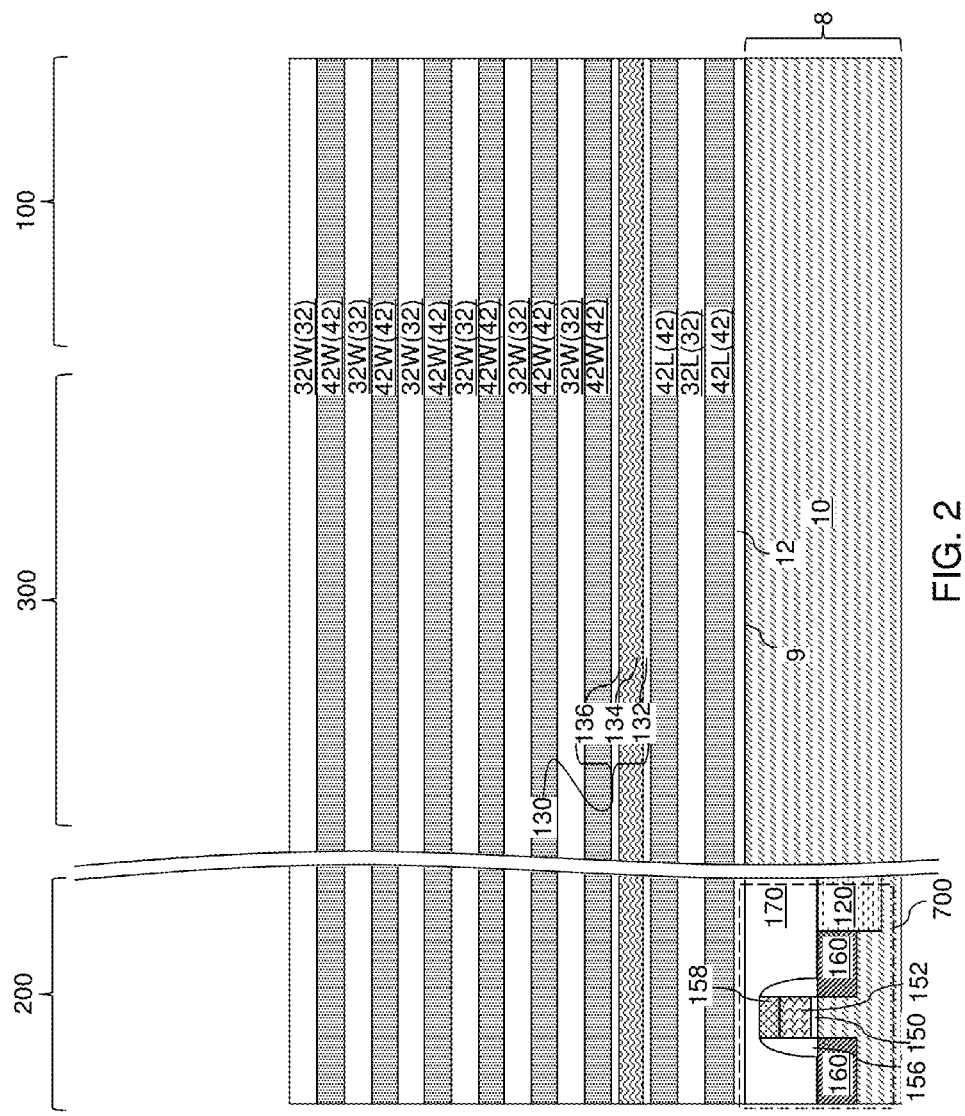
FIG. 2 is a vertical cross-sectional view of the exemplary structure after formation of an alternating stack of insulating layers and spacer material layers according to an embodiment of the present disclosure.

Referring to FIG. 2, an alternating stack of word-line-level spacer material layers 42W and word-line-level insulating layers 32W can be formed over the vertically-insulating layers stack 130. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The word-line-level spacer material layers 42W are spacer material layers (i.e., a material layer that separates an underlying element form an overlying element) having a same composition as the at least one lower-select-gate-level spacer material layer 42L. In case at least one lower-select-gate-level insulating layer 32L is provided, the word-line-level insulating layers 32W can have the same composition as the at least one lower-select-gate-level insulating layer 32L.

In the present disclosure, if the word-line-level spacer material layers 42W are distinguished from the lower-select-gate-level spacer material layer 42L or optional upper-select-gate-level spacer material layers that may be subsequently formed, the word-line-level spacer material layers 42W are identified as the "word-line-level spacer material layers." If the word-line-level spacer material layers 42W are treated as an element among the set of all spacer material layers 42, the word-line-level spacer material layers 42W are identified as a subset of the "spacer material layers 42." The word-line-level spacer material layers 42W are formed at word line levels, which are the levels at which word lines of the memory device of the present disclosure are present (in case the spacer material layers 42 are electrically conductive layers), or are subsequently formed (in case the spacer material layers 42 are formed as sacrificial material layers and are subsequently replaced with electrically conductive layers).

In one embodiment, the spacer material layers 42 may be sacrificial material layers that are replaced with respective electrically conductive layers. In another embodiment, the spacer material layers 42 can be formed as electrically conductive layers.

The word-line-level insulating layers 32W can have the same composition as the at least one lower-select-gate-level insulating layer 32L. In the present disclosure, if the word-line-level insulating layers 32W are distinguished from at least one lower-select-gate-level insulating layer 32L and/or at least one upper-select-gate-level insulating layer that can be subsequently formed, the word-line-level insulating layers 32W are identified as the "word-line-level insulating layers." If the word-line-level insulating layers 32W are treated as an element among the set of all insulating layers 32, the word-line-level insulating layers 32W are identified as a subset of the "insulating layers 32." The word-line-level insulating layers 32W alternate with the word-line-level spacer material layers 42W within the alternating stack (32W, 42W).

The word-line-level spacer material layer 42W is a second subset of spacer material layers 42 formed over the gate dielectric layer 12 in the exemplary structure. The word-line-level insulating layer 32W is a second subset of insulating layers 32 formed over the gate dielectric layer 12 in the exemplary structure.

The thickness of each of the word-line-level spacer material layers 42W can be in a range from 20 nm to 50 nm, although lesser and greater thicknesses can also be employed. The thickness of each of the word-line-level insulating layers 32W can be in a range from 20 nm to 50 nm, although lesser and greater thicknesses can also be employed.

The insulating layers 32 can be composed of the first material, and the spacer material layers 42 can be composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the spacer material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The spacer material layers 42 may comprise an insulating material, a semiconductor material, or a conductive material. The second material of the spacer material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the spacer material layers 42 can be spacer material layers that comprise silicon nitride or a semiconductor material including at least one of silicon and germanium.

In one embodiment, the insulating layers 32 can include silicon oxide, and sacrificial material layers can include silicon nitride. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the spacer material layers 42 can be formed, for example, CVD or atomic layer deposition (ALD). The alternating stack (32W, 42W) can terminate with a word-line-level spacer material layer 42W at a top end thereof.

Figure 3A:
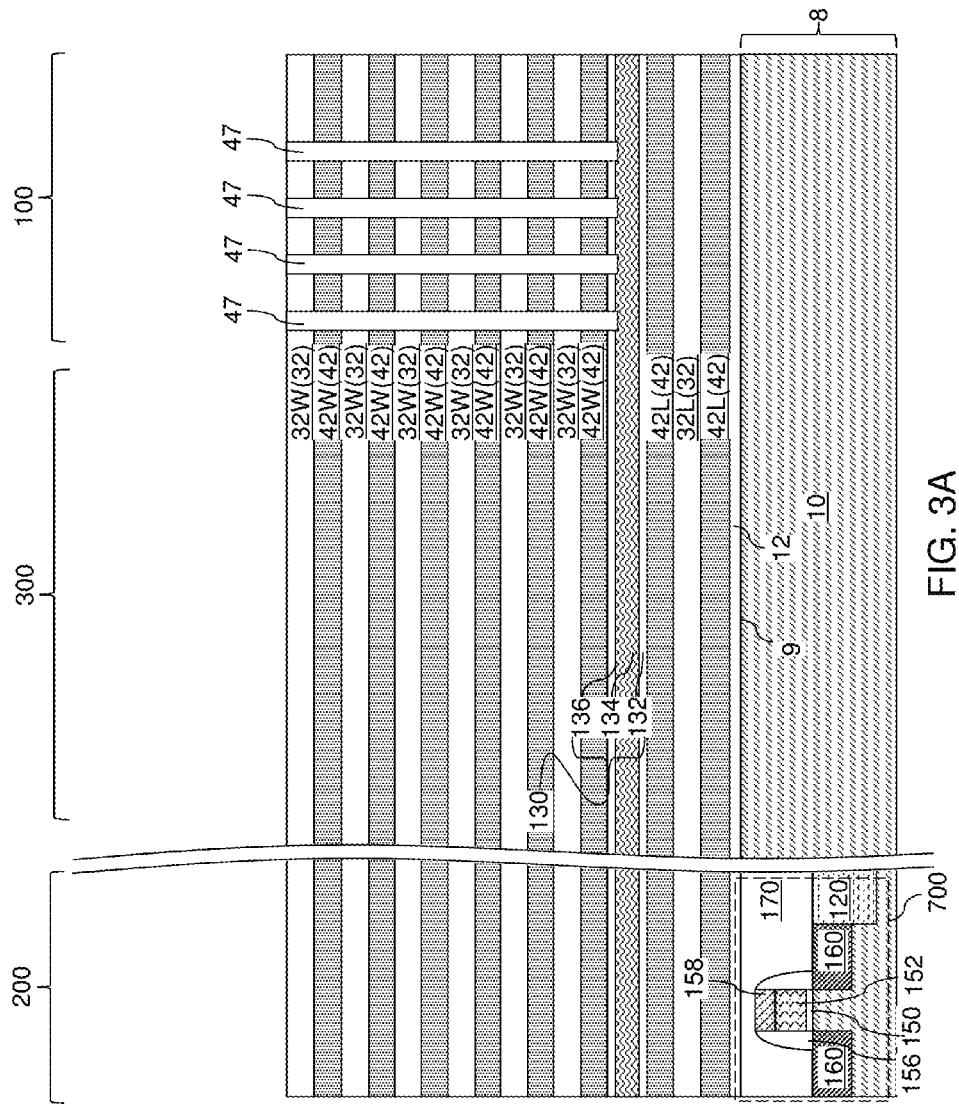
FIG. 3A is a vertical cross-sectional view of the exemplary structure after formation of separator insulator structures through the alternating stack according to an embodiment of the present disclosure.
Figure 3B:
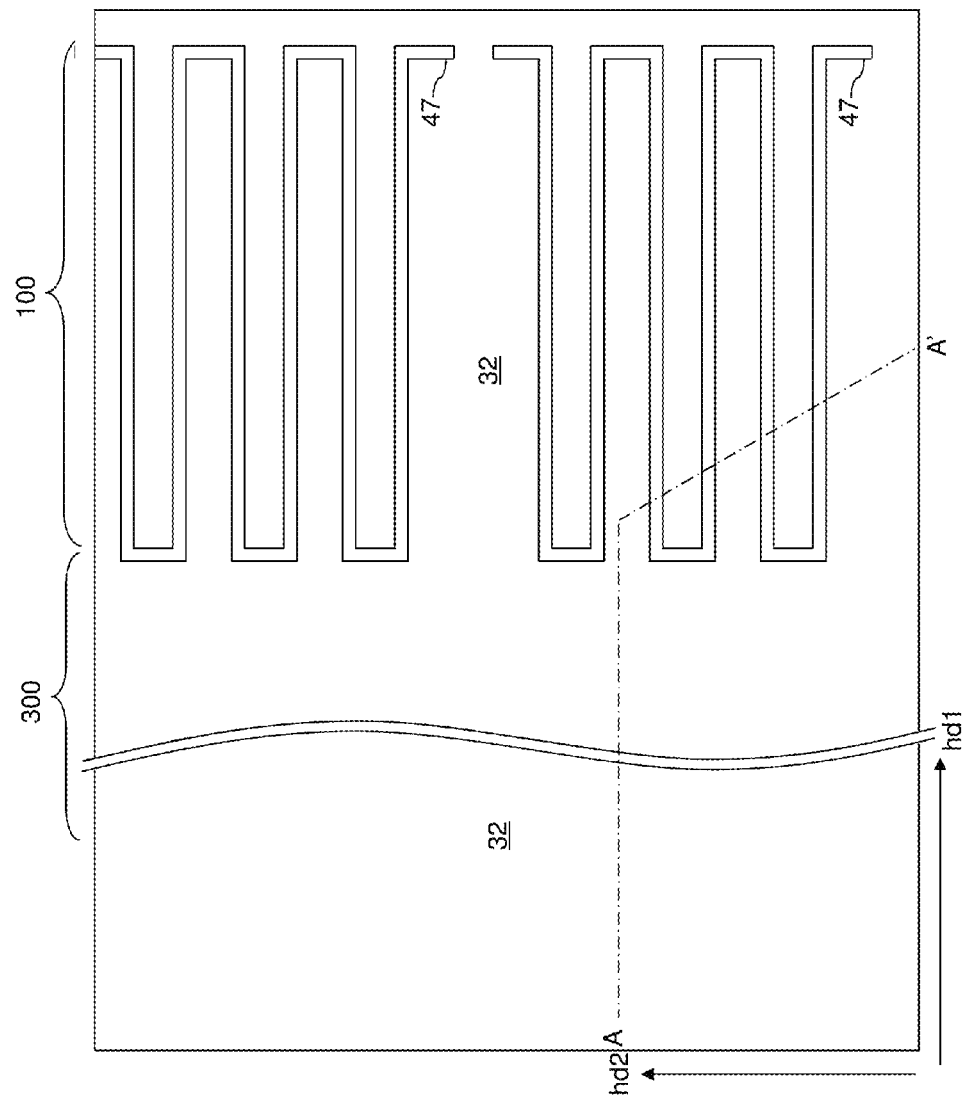
FIG. 3B is a top-down view of the exemplary structure of FIG. 3A. The vertical plane A-A' corresponds to the plane of the vertical cross-sectional view of FIG. 3A.
Figure 4:
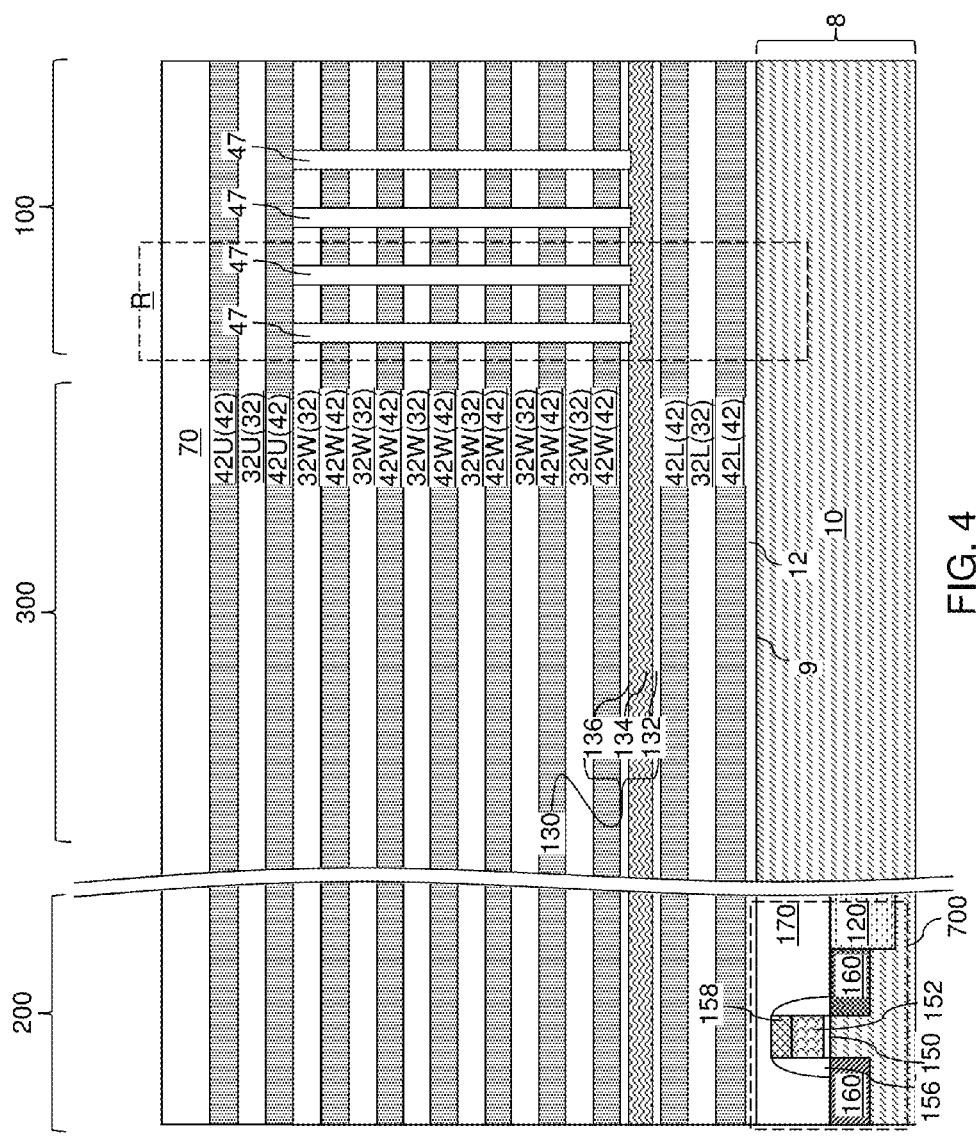
FIG. 4 is a vertical cross-sectional view of the exemplary structure after formation of at least one upper-select-level spacer material layer and optional at least one upper-select-level insulating layer according to an embodiment of the present disclosure.
Figure 5D:
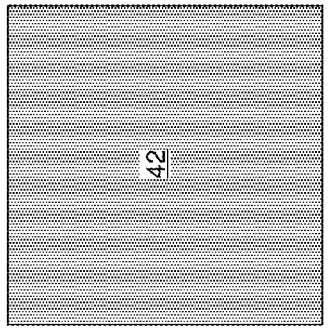
FIG. 5D is a horizontal cross-sectional view of the region R along the horizontal plane D-D' of FIG. 5A.
Figure 5A:
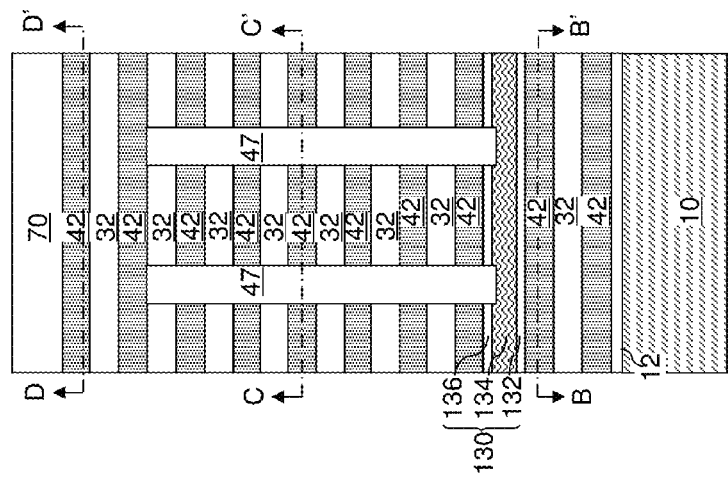
FIG. 5A is a vertical cross-sectional view of a region R of the exemplary structure of FIG. 4.
Figure 5C:
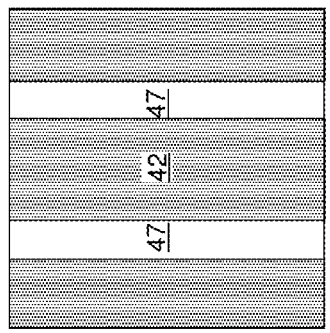
FIG. 5C is a horizontal cross-sectional view of the region R along the horizontal plane C-C' of FIG. 5A.
Figure 5B:
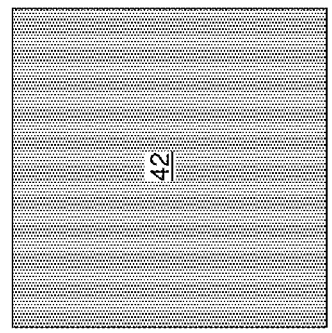
FIG. 5B is a horizontal cross-sectional view of the region R along the horizontal plane B-B' of FIG. 5A.

Referring to FIGS. 3A and 3B, separator trenches can be formed through the alternating stack (32W, 42W) for example, by application and patterning of a photoresist layer (not shown) over the alternating stack (32W, 42W), and transfer of the pattern in the photoresist layer through the alternating stack (32W, 42W) employing an anisotropic etch process. The anisotropic etch process can employ the at least one etch stop layer, such as the vertically-insulating layer stack 130 as a stopping structure. For example, the etch chemistry of the anisotropic etch process can be selected to etch through the first and second materials of the alternating stack (32W, 42W), and to be selective to the material of the etch stop material layer 134. For example, the spacer material layers 42 can include silicon nitride, the insulating layers 32 can include silicon oxide, and the etch stop material layer 134 can include a silicon-containing semiconductor material such as polysilicon, amorphous silicon, or a silicon-germanium alloy. The bottom surface of each separator trench can be formed on a topmost surface or a recessed top surface of the etch stop material layer 134. The photoresist layer can be subsequently removed, for example, by ashing.

Each separator trench can be filled with a dielectric material, which may be the same as, or may be different from, the material of the insulating layers 32. The dielectric material that fills the separator trenches is different from the material of the spacer material layers 42. The dielectric material that fills the separator trenches is herein referred to as a separator insulating material. For example, the separator insulating material can be undoped silicate glass or doped silicate glass. Excess portions of the separator insulating material can be removed from above the top surface of the alternating stack, for example, by chemical mechanical planarization (CMP), a recess etch, or a combination thereof. Remaining portions of the deposited separator insulating material constitutes separator insulator structures 47, which are separator structures including an insulating material. As used herein, a separator structure refers to a structure that physically separates at least two portions of a material layer. In one embodiment, the separator insulator structures 47 can laterally separate each layer within the alternating stack (32W, 42W) to separate the alternating stack (32W, 42W) into multiple regions including interdigitated structures in which fingers of each material layer within the alternating stack (32W, 42W) extend along a first horizontal direction hd1 and neighboring fingers are laterally spaced from one another along a second horizontal direction hd2 that is perpendicular to the first horizontal direction hd1. The separator insulator structures 47 do not extent below the bottom surface of the vertically-insulating layer stack 130.

Referring to FIGS. 4 and 5A-5D, at least one upper-select-level spacer material layer 42U and optional at least one upper-select-level insulating layer 32U may be optionally formed over the alternating stack (32W, 42W) and the separator insulator structures 47. The at least one upper-select-gate-level spacer material layer 42U is a third subset of spacer material layers 42 formed over the gate dielectric layer 12 in the exemplary structure. The at least one upper-select-gate-level spacer material layer 42U can have the same composition as the word-line-level spacer material layers 42W in the alternating stack (32W, 42W).

In the present disclosure, if the at least one upper-select-gate-level spacer material layer 42U is distinguished from the lower-select-gate-level spacer material layers 42L or the word-line-level spacer material layers 42W, the at least one upper-select-gate-level spacer material layer 42U is identified as the "at least one upper-select-gate-level spacer material layer." If the at least one upper-select-gate-level spacer material layer 42U is treated as an element among the set of all spacer material layers 42, the at least one upper-select-gate-level spacer material layer 42U is identified as one of the "spacer material layers 42." The at least one upper-select-gate-level spacer material layer 42U is formed at an upper select gate level, which is the level at which a set of at least one upper select gate electrode is formed (as at least one electrically conductive layers), or is subsequently formed (by replacement of a respective sacrificial material layer). The at least one upper select gate electrode can be employed to select a set of vertical semiconductor channel connected to a common source region.

In case the at least one upper-select-gate-level spacer material layer 42U includes a plurality of upper-select-gate-level spacer material layers 42U, the upper-select-gate-level insulating layer 32U can be provided between each vertically neighboring pair of upper-select-gate-level spacer material layers 42U. The at least one upper-select-gate-level insulating layer 32U is a third subset of insulating layers 32 formed over the gate dielectric layer 12 in the exemplary structure. The at least one upper-select-gate-level insulating layer 32U can have the same composition the word-line-level insulating layers 32W in the alternating stack (32W, 42W). In the present disclosure, if the at least one upper-select-gate-level insulating layer 32U is distinguished from the at least one lower-select-gate-level insulating layer 32L or the word-line-level insulating layers 32W, the at least one upper-select-gate-level insulating layer 32U is identified as the "at least one upper-select-gate-level insulating layer." If the at least one upper-select-gate-level insulating layer 32U is treated as an element among the set of all insulating layers 32 (additional subsets of which are to be subsequently formed), the at least one upper-select-gate-level insulating layer 32U is identified as one of the "insulating layers 32." The at least one upper-select-gate-level insulating layer 32U is formed between each neighboring pair of upper select gate levels.

The at least one upper-select-gate-level spacer material layer 42U can include the same material as the lower-select-gate-level spacer material layers 42L and the word-line-level spacer material layers 42W. The at least one insulating layer 32U, if present, can include the same material as the at least one lower-select-gate-level insulating layer 32L and the word-line-level insulating layers 32W. The thickness of each of the at least one upper-select-gate-level spacer material layer 42U can be in a range from 20 nm to 50 nm, although lesser and greater thicknesses can also be employed. The thickness of each of the at least one upper-select-gate-level insulating layer 32U can be in a range from 20 nm to 50 nm, although lesser and greater thicknesses can also be employed.

Optionally, an insulating cap layer 70 can be formed over the topmost layer among the at least one upper-select-gate-level spacer material layer 42U. The insulating cap layer 70 includes a dielectric material that is different from the material of the spacer material layers 42. In one embodiment, the insulating cap layer 70 can include a dielectric material that can be employed for the insulating layers 32. In one embodiment, the insulating cap layer 70 can have the same material as the insulating layers 32. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 6:
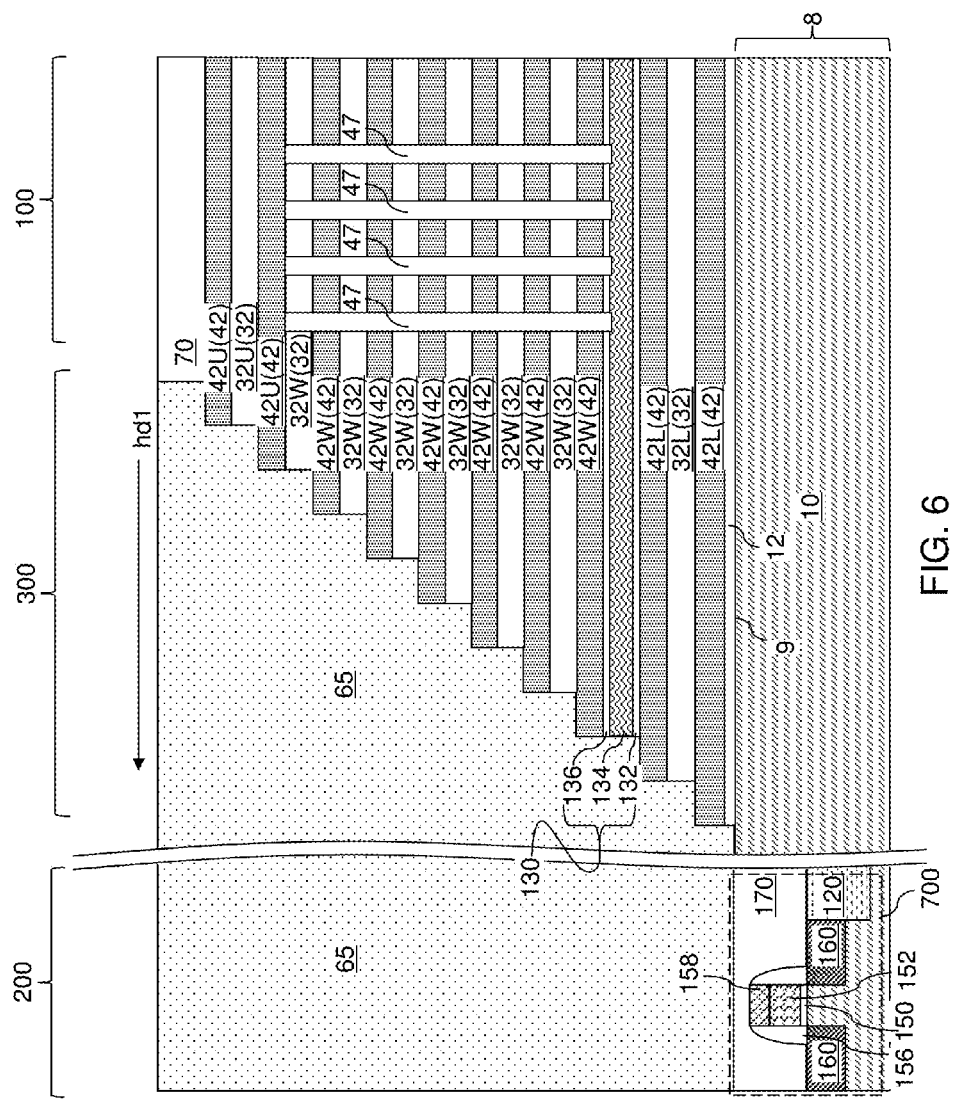
FIG. 6 is a vertical cross-sectional view of the exemplary structure after formation of stepped terraces and a retro-stepped dielectric material portion according to an embodiment of the present disclosure.
Figure 7A:
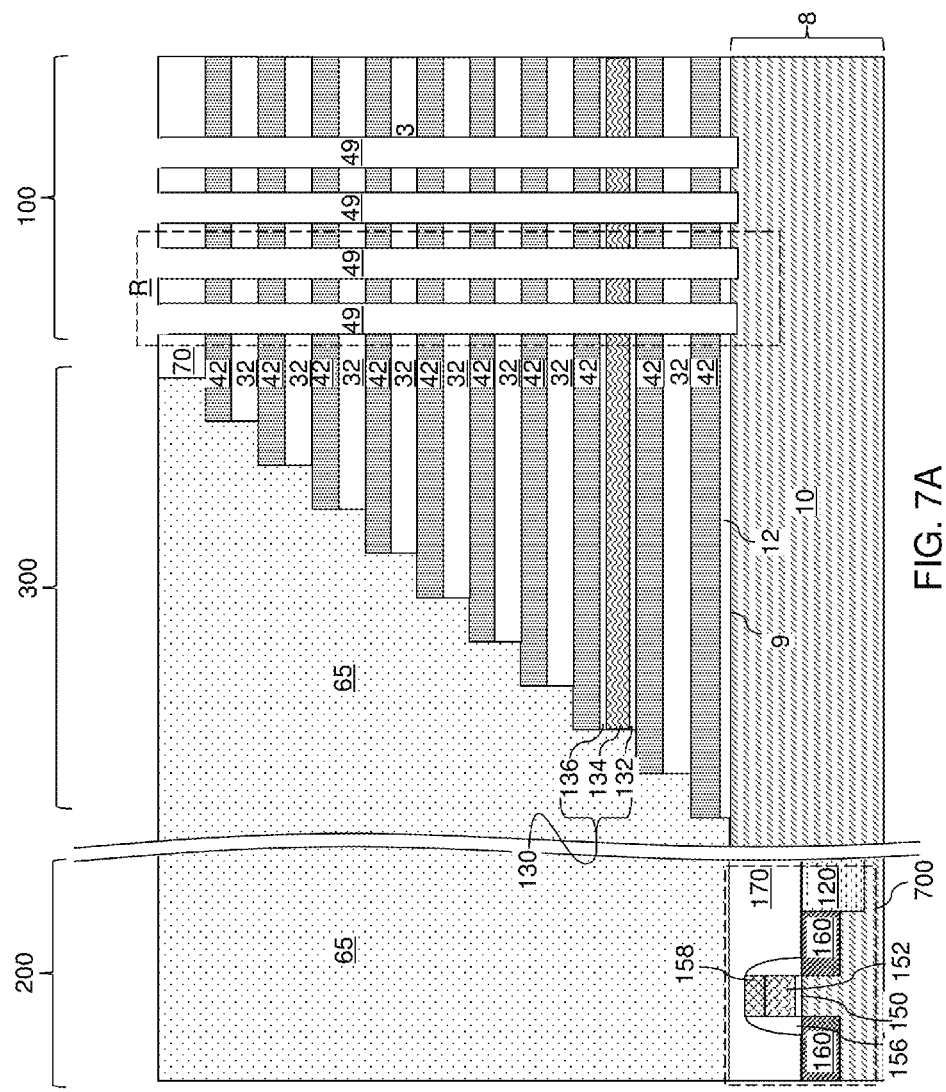
FIG. 7A is a vertical cross-sectional view of the exemplary structure after formation of memory openings according to an embodiment of the present disclosure.
Figure 7B:
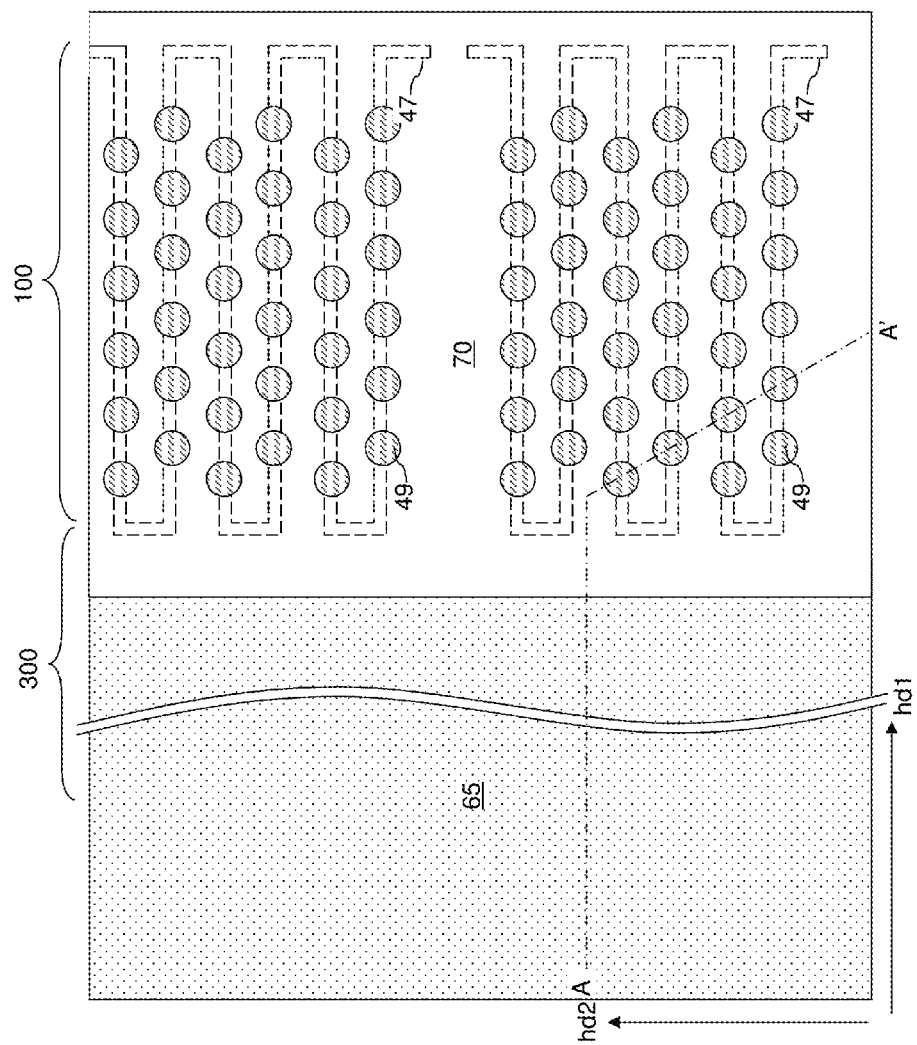
FIG. 7B is a top-down view of the exemplary structure of FIG. 7A. The vertical plane A-A' corresponds to the plane of the vertical cross-sectional view of FIG. 7A.
Figure 9D:
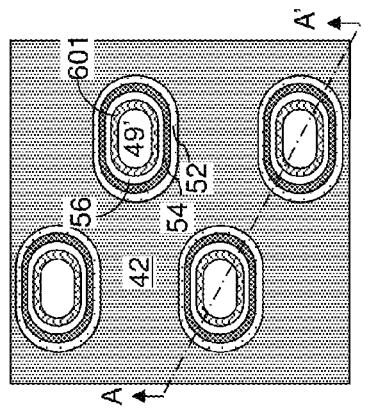
FIG. 9D is a horizontal cross-sectional view of the region R along the horizontal plane D-D' of FIG. 9A.
Figure 9A:
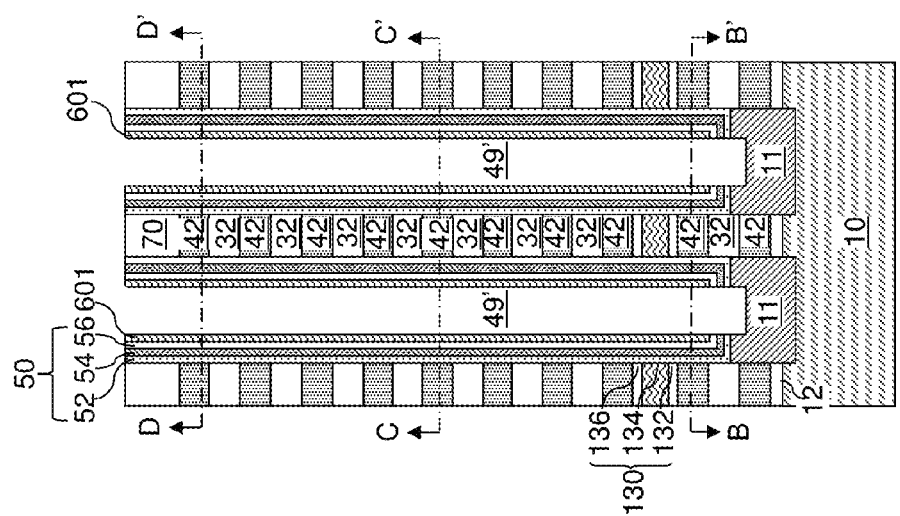
FIG. 9A is a vertical cross-sectional view of the region R of the exemplary structure after formation of a memory film and a first semiconductor channel layer within each memory opening according to an embodiment of the present disclosure.
Figure 9C:
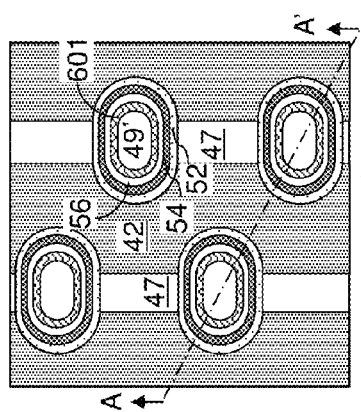
FIG. 9C is a horizontal cross-sectional view of the region R along the horizontal plane C-C' of FIG. 9A.
Figure 9B:
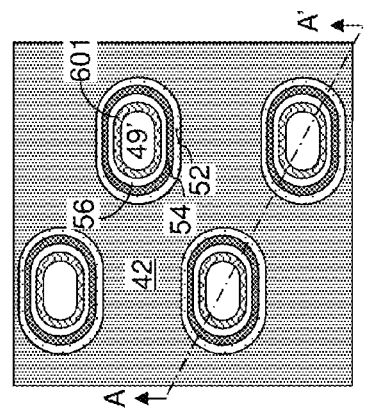
FIG. 9B is a horizontal cross-sectional view of the region R along the horizontal plane B-B' of FIG. 9A.
Figure 10D:
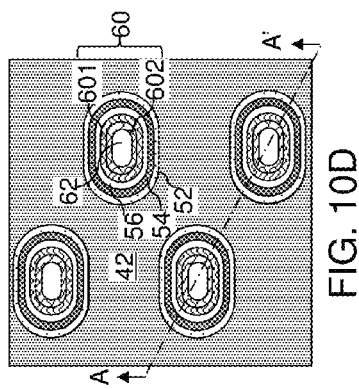
FIG. 10D is a horizontal cross-sectional view of the region R along the horizontal plane D-D' of FIG. 10A.
Figure 10A:
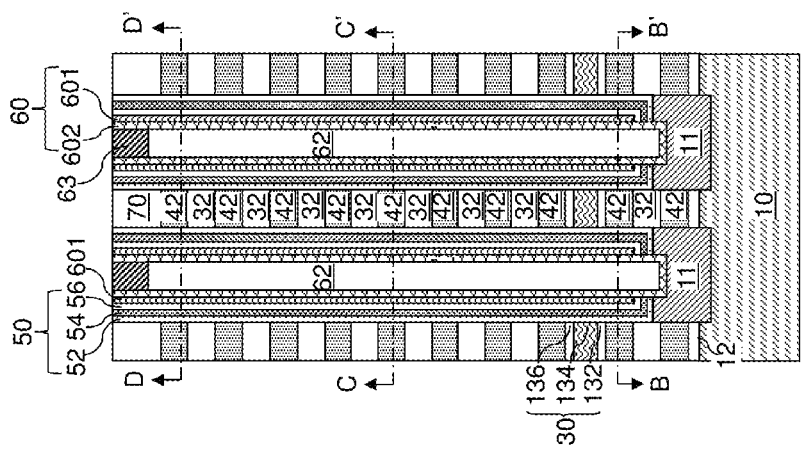
FIG. 10A is a vertical cross-sectional view of the region R of the exemplary structure after formation of a second semiconductor channel layer, a dielectric core, and a drain region within each memory opening according to an embodiment of the present disclosure.
Figure 10C:
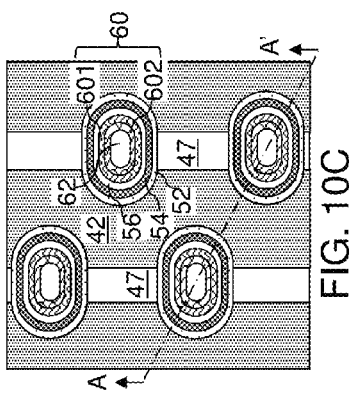
FIG. 10C is a horizontal cross-sectional view of the region R along the horizontal plane C-C' of FIG. 10A.
Figure 10B:
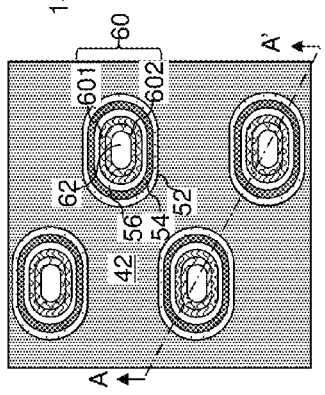
FIG. 10B is a horizontal cross-sectional view of the region R along the horizontal plane B-B' of FIG. 10A.

Referring to FIG. 6, a stepped cavity can be formed within the contact region 300. As used herein, a "stepped cavity" refers to a cavity including stepped surfaces that include a continuous set of surfaces including vertical surface and horizontal surfaces that are adjoined to provide different lateral extents. In one embodiment, an upper region of the stepped cavity can have a greater lateral extent than a lower region of the stepped cavity. In one embodiment, each overlying portion of the stepped cavity can have a greater lateral extent than any underlying portion of the stepped cavity.

Specifically, the entire set of the spacer material layers 42 and the insulating layers 32 can be patterned to form a stepped cavity in the contact region 300. The stepped cavity includes stepped terraces, which are a set of stepped surfaces that continuously extend from the bottommost layer of the entire set of the spacer material layers 42 and the insulating layers 32 to the topmost layer of the entire set of the spacer material layers 42 and the insulating layers 32. Within the terrace region, each spacer material layer 42 other than a topmost spacer material layer within the entire set of the spacer material layers 42 and the insulating layers 32 laterally extends farther than any overlying spacer material layers within the entire set of the spacer material layers 42 and the insulating layers 32. Thus, the topmost spacer material layer 42 can have the least lateral extent along a horizontal direction, the second-from-the-top spacer material layer 42 can have a greater lateral extent along the horizontal direction, the third-from-the-top sacrificial material layer can have a greater lateral extent than the topmost spacer material layer 42 and the second-from-the-top spacer material layer 42, and so on. In one embodiment, a sidewall of the gate dielectric layer 12 and a top surface of the planarization dielectric layer 170 can be physically exposed to the stepped cavity.

A portion of the terrace region is formed on the alternating stack (32W, 42W). Each word-line-level spacer material layer 42W other than the topmost spacer material layer 42W within the alternating stack (32W, 42W) laterally extends farther than any overlying spacer material layers 42W within the alternating stack (32W, 42W) along a horizontal direction. The terrace region includes stepped surfaces of the alternating stack (32W, 42W) that continuously extend from the bottommost layer within the alternating stack (32W, 42W) to the topmost layer within the alternating stack (32W, 42W).

In one embodiment, the horizontal cross-sectional shape of the stepped cavity changes in steps as a function of the vertical distance from the top surface of the substrate 8. In one embodiment, the stepped cavity can be formed applying and initially patterning a trimmable masking material layer, and by repetitively performing a set of processing steps. The set of processing steps can include, for example, an etch process of a first type (such as an anisotropic reactive ion etch) that vertically increases the depth of a cavity by one or more levels, and an etch process of a second type (referred to as a trimming process) that laterally expands the area to be vertically etched in a subsequent etch process of the first type. As used herein, a "level" of a structure including alternating plurality is defined as the relative position of a pair of a first material layer and a second material layer within the structure.

A retro-stepped dielectric material portion 65 can be formed in the stepped cavity by deposition of a dielectric material therein. The retro-stepped dielectric material portion 65 includes a dielectric fill material such as silicon oxide. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. The retrostepped dielectric material portion 65 contacts the stepped surfaces of the entire set of the spacer material layers 42 and the insulating layers 32.

Referring to FIGS. 7A, 7B, and 8A-8D, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through the entirety of the entire set of the spacer material layers 42 and the insulating layers 32 by at least one anisotropic etch that employs the patterned lithographic material stack as an etch mask. Portions of the entire set of the spacer material layers 42 and the insulating layers 32 underlying the openings in the patterned lithographic material stack are etched to form memory openings 49. In other words, the transfer of the pattern in the patterned lithographic material stack through the entire set of the spacer material layers 42 and the insulating layers 32 forms the memory openings 49 that extend through the entire set of the spacer material layers 42 and the insulating layers 32. The chemistry of the anisotropic etch process employed to etch through the materials of the entire set of the spacer material layers 42 and the insulating layers 32 can alternate to optimize etching of the first and second materials in the entire set of the spacer material layers 42 and the insulating layers 32. The anisotropic etch can be, for example, a series of reactive ion etches. The sidewalls of the memory openings 49 can be substantially vertical, or can be tapered. The patterned lithographic material stack can be subsequently removed, for example, by ashing.

In one embodiment, the memory openings 49 can be formed through the separator insulator structures 47. In case the separator insulator structures 47 includes portions that extend horizontally along the first horizontal direction hd1, the memory openings 49 can include rows of memory openings 49 that are arranged along the first horizontal direction hd1. In other words, each row of memory openings 49 can extend along the first horizontal direction hd1 such that the memory opening 49 in each row divide a respective intersecting portion of a separator insulator structure 47 into multiple separator insulator structures 47. Each row of memory openings 49 can be laterally spaced from one another along the second horizontal direction hd2. In one embodiment, each memory opening 49 can be formed through a portion of a respective separator insulator structure 47. Each of the separator insulator structures 47 can be divided into multiple segments upon formation of the memory openings 49.

In one embodiment, the lateral direction of each memory opening 49 along the second horizontal direction hd2 can be greater than the width of the respective portion of the separator insulator structures 47 (which are intersected by the memory openings) along the second horizontal direction hd2. This configuration enables exposure of two different fingers of the word-line-level spacer material layers 42W at each word line level around each memory opening 49, while providing physical exposure of a single portion of a respective lower-select-gate-level spacer material layer 42L or a respective upper-select-gate-level spacer material layer 42U at each select gate level.

The memory openings 49 are formed through the gate dielectric layer 12 so that the memory openings 49 extend from the top surface of the entire set of the spacer material layers 42 and the insulating layers 32 to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The array of memory openings 49 is formed in the memory array region 100.

Referring to FIGS. 9A-9D, an optional epitaxial channel portion 11 (e.g., an epitaxial pedestal) can be formed at the bottom portion of each memory opening 49, for example, by selective epitaxy. In one embodiment, in case the etch stop material layer 134 includes a semiconductor material, a thermal oxidation process or a thermal nitridation process can be performed to convert a surface portion of the etch stop material layer 134 at a periphery of each memory opening 49 into a tubular dielectric semiconductor oxide portion or a tubular dielectric semiconductor nitride portion. A planar dielectric semiconductor oxide/nitride portion can be collaterally formed by conversion of each physically exposed surface portion of the semiconductor material layer 10. The planar dielectric semiconductor oxide/nitride portions can be removed by an anisotropic etch, while the tubular dielectric semiconductor oxide/nitride portions (not shown) remain around each memory opening. A surface clean process (such as a dilute hydrofluoric acid wet etch) can be performed to provide a clean semiconductor surface of the semiconductor material layer 10 at the bottom of each memory opening 49 prior to formation of the epitaxial channel portions 11.

Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed at a level of a lower-select-gate-level insulating layer 32.

The epitaxial channel portion 11 can be a portion of a transistor channel that extends between a source region to be subsequently formed in the substrate 8 and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts.

A stack of layers including a blocking dielectric layer 52, a memory material layer 54, a tunneling dielectric layer 56, and an optional first semiconductor channel layer 601 can be sequentially deposited in the memory openings 49. In one embodiment, the blocking dielectric layer 52 can include a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The blocking dielectric layer 52 can be deposited, for example, by chemical vapor deposition (CVD), atomic layer deposition (ALD), pulsed laser deposition (PLD), liquid source misted chemical deposition, or a combination thereof. In one embodiment, the blocking dielectric layer 52 includes aluminum oxide.

Alternatively or additionally, the blocking dielectric layer 52 can include a dielectric material that is different from the dielectric material of the blocking dielectric layer 52. For example, the blocking dielectric layer 52 can include silicon oxide, silicon oxynitride, silicon nitride, or a combination thereof. In one embodiment, the blocking dielectric layer 52 can include a stack including an aluminum oxide layer and a silicon oxide layer. The blocking dielectric layer 52 can be formed by a conformal deposition method such as low pressure chemical vapor deposition, atomic layer deposition, or a combination thereof. The thickness of the blocking dielectric layer 52 can be in a range from 1 nm to 20 nm, although lesser and greater thicknesses can also be employed. The blocking dielectric layer 52 can subsequently function as a dielectric material portion that blocks leakage of stored electrical charges to control gate electrodes. Alternatively, the blocking dielectric layer 52 can be omitted, and a blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into spacer material layers 42. In one embodiment, the memory material layer 54 includes a silicon nitride layer. In one embodiment, the spacer material layers 42 and the insulator layers 32 can have vertically coincident sidewalls, and the memory material layer 54 can be formed as a single continuous layer.

In another embodiment, the spacer material layers 42 can be laterally recessed with respect to the sidewalls of the insulator layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

The memory material layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

The optional first semiconductor channel layer 601, the tunneling dielectric layer 56L, the memory material layer 54, the blocking dielectric layer 52 are sequentially anisotropically etched employing at least one anisotropic etch process. The portions of the first semiconductor channel layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the memory material layer 54, and the blocking dielectric layer 52 at a bottom of each cavity 49' can be removed to form openings in remaining portions thereof. Each of the first semiconductor channel layer 601, the tunneling dielectric layer 56, the memory material layer 54, and the blocking dielectric layer 52 can be etched by anisotropic etch process.

The memory material layer 54 can comprise a charge trapping material or a floating gate material. In one embodiment, each memory material layer 54 can include a vertical stack of charge storage regions that store electrical charges upon programming. In one embodiment, the memory material layer 54 can be a charge storage layer in which each portion adjacent to the spacer material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the memory material layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the memory material layer 54. A set of blocking dielectric layer 52, a memory material layer 54, and a tunneling dielectric layer 56 in a memory opening 49 constitutes a memory film 50, which includes a plurality of charge storage regions (as embodied as the memory material layer 54) that are insulated from surrounding materials by the blocking dielectric layer 52 and the tunneling dielectric layer 56. In one embodiment, the first semiconductor channel layer 601, the tunneling dielectric layer 56, the memory material layer 54, the blocking dielectric layer 52, and the blocking dielectric layer 52 can have vertically coincident sidewalls.

Referring to FIGS. 10A-10D, a second semiconductor channel layer 602 can be deposited directly on the semiconductor surface of the epitaxial channel portion 11 (or on the semiconductor substrate layer 10 if epitaxial channel portion 11 is omitted), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the cavity 49' in each memory opening is not completely filled by the second semiconductor channel layer 602, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch from above the top surface of the insulating cap layer 70. Each remaining portion of the dielectric core layer constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

The top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each adjoining set of a vertical semiconductor channel 60 and a memory film 50 constitutes a memory stack structure 55, which includes a vertical stack of memory elements that can be embodied as portions of the memory material layer 54 located at the levels of the spacer material layers 42. An epitaxial channel portion 11 can be provided at a bottom of each memory opening 49. Each memory stack structure 55 can be provided over a respective epitaxial channel portion 11.

Figure 11:
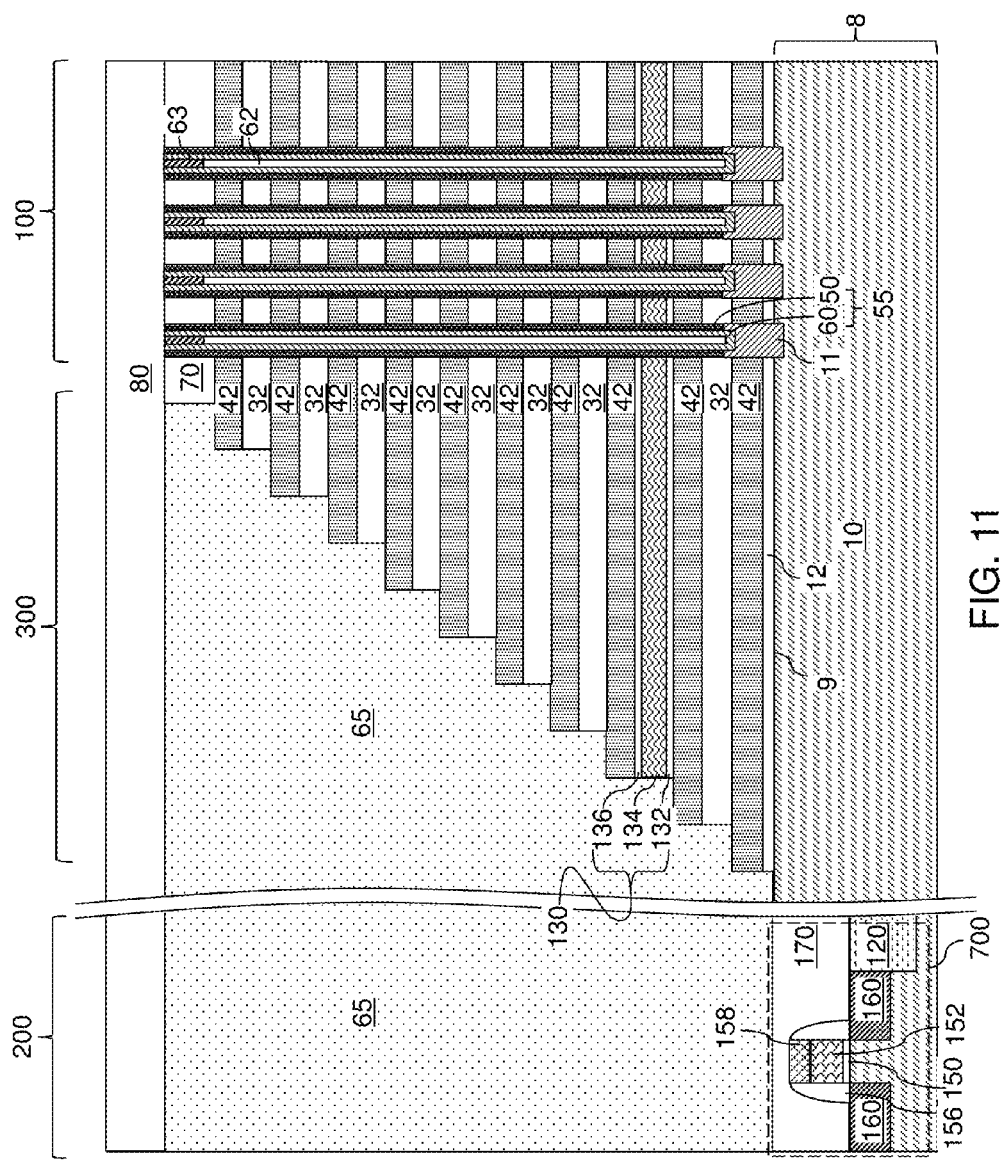
FIG. 11 is a vertical cross-sectional view of the exemplary structure after formation of a contact level dielectric layer according to an embodiment of the present disclosure.

The exemplary memory stack structure 55 can be embedded into the exemplary structure illustrated in FIGS. 7A, 7B, and 8A-8D. FIG. 11 illustrates the exemplary structure that incorporates multiple instances of the exemplary memory stack structure of FIGS. 10A-10D. Each exemplary memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as portions of a memory material layer 54) and an optional blocking dielectric layer 52. The exemplary structure includes an entire set of the spacer material layers 42 and the insulating layers 32 including an alternating plurality of material layers (e.g., the spacer material layers 42) and insulating layers 32 located over a semiconductor substrate (e.g., over the semiconductor material layer 10), and a memory opening extending through the entire set of the spacer material layers 42 and the insulating layers 32. While the present disclosure is described employing the illustrated configuration for the memory stack structure, the methods of the present disclosure can be applied to alternative memory stack structures including a polycrystalline semiconductor channel.

At least one support pillar (not shown) can be formed through the entire set of the spacer material layers 42 and the insulating layers 32, for example, by formation of openings therethrough and filling of the openings with a material. The support pillar may comprise a dummy memory stack structure which contains the same layers and is formed at the same time as the memory stack structures 55, but which is not electrically connected to a bit line 96 (shown in FIG. 18). Alternatively, the support pillar may comprise a dielectric support pillar comprising an insulating material. Optionally, a contact level dielectric layer 80 may be formed over the insulating cap layer 70 and the retro-stepped dielectric material portion 65. The contact level dielectric layer 80 and the at least one dielectric support pillar can be formed as a single continuous structure of integral construction, i.e., without any material interface therebetween. In another embodiment, the portion of the dielectric material that is deposited over the insulating cap layer 70 concurrently with deposition of the at least one dielectric support pillar can be removed, for example, by chemical mechanical planarization or a recess etch. In this case, the contact level dielectric layer 80 is not present, and the top surface of the insulating cap layer 70 can be physically exposed.

Figure 12A:
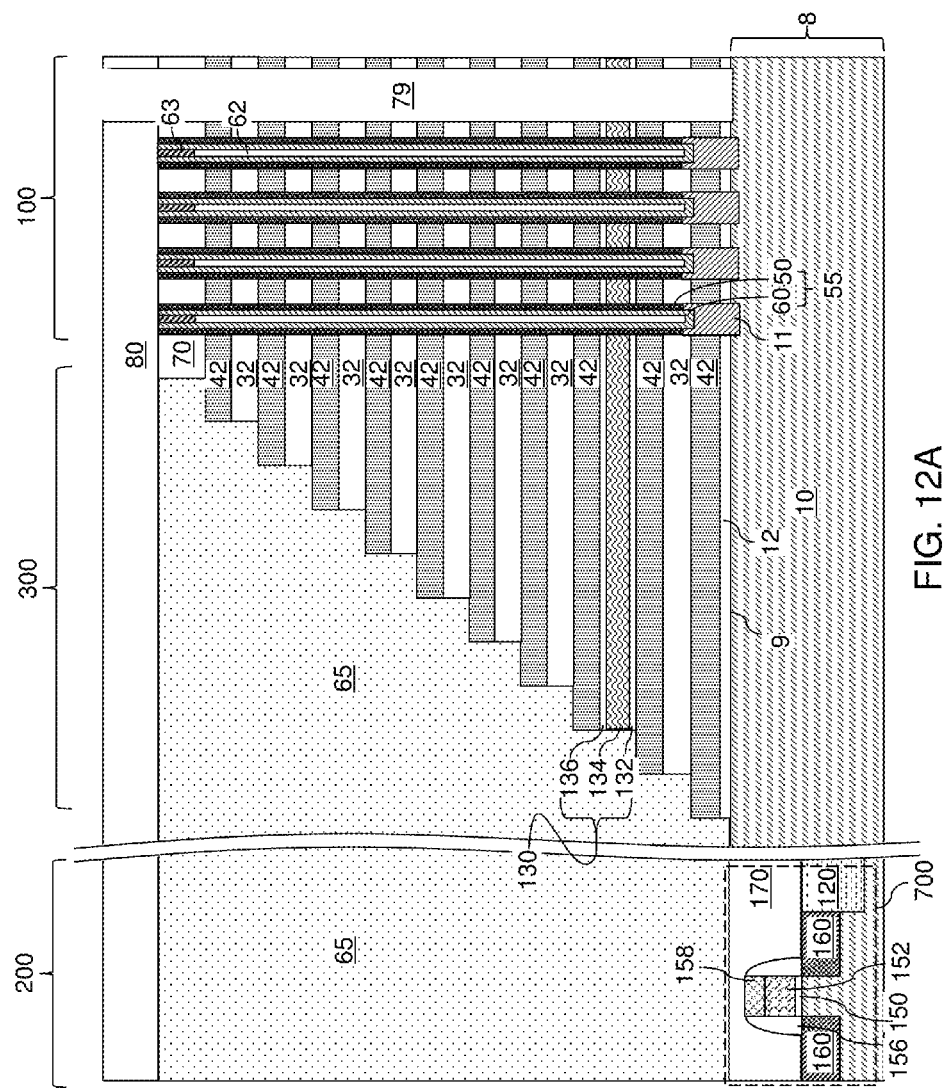
FIG. 12A is a vertical cross-sectional view of the exemplary structure after formation of a backside contact trench according to an embodiment of the present disclosure.

Referring to FIGS. 12A and 12B, backside trenches 79 can be formed through the entire set of the spacer material layers 42 and the insulating layers 32 (including the alternating stack (32W, 42W), the at least one lower-select-gate-level spacer material layer 42L, and the optional at least one upper-select-gate-level spacer material layer 42U) and through the vertically-insulating layer stack 130. Each of the backside trenches 79 can extend horizontally along the first horizontal direction hd1. Each layer within the entire set of the spacer material layers 42 and the insulating layers 32 and the vertically-insulating layer stack 130 is divided into multiple portions along the second horizontal direction hd2 that is perpendicular to the first horizontal direction hd1 by the backside trenches 79.

For example, a photoresist layer (not shown) can be applied over the entire set of the spacer material layers 42 and the insulating layers 32, and can be lithographically patterned to form elongated openings extending along the first horizontal direction hd1. The pattern in the photoresist layer can be transferred through the entire set of the spacer material layers 42 and the insulating layers 32 and/or the retro-stepped dielectric material portion 65 employing an anisotropic etch to form the backside contact trenches 79, which extend at least to the top surface of the substrate 8. In one embodiment, the backside contact trenches 79 can include a source contact opening in which a source contact via structure can be subsequently formed. A top surface of the semiconductor material layer 10 can be physically exposed at the bottom of each backside contact trench 79.

Figure 13:
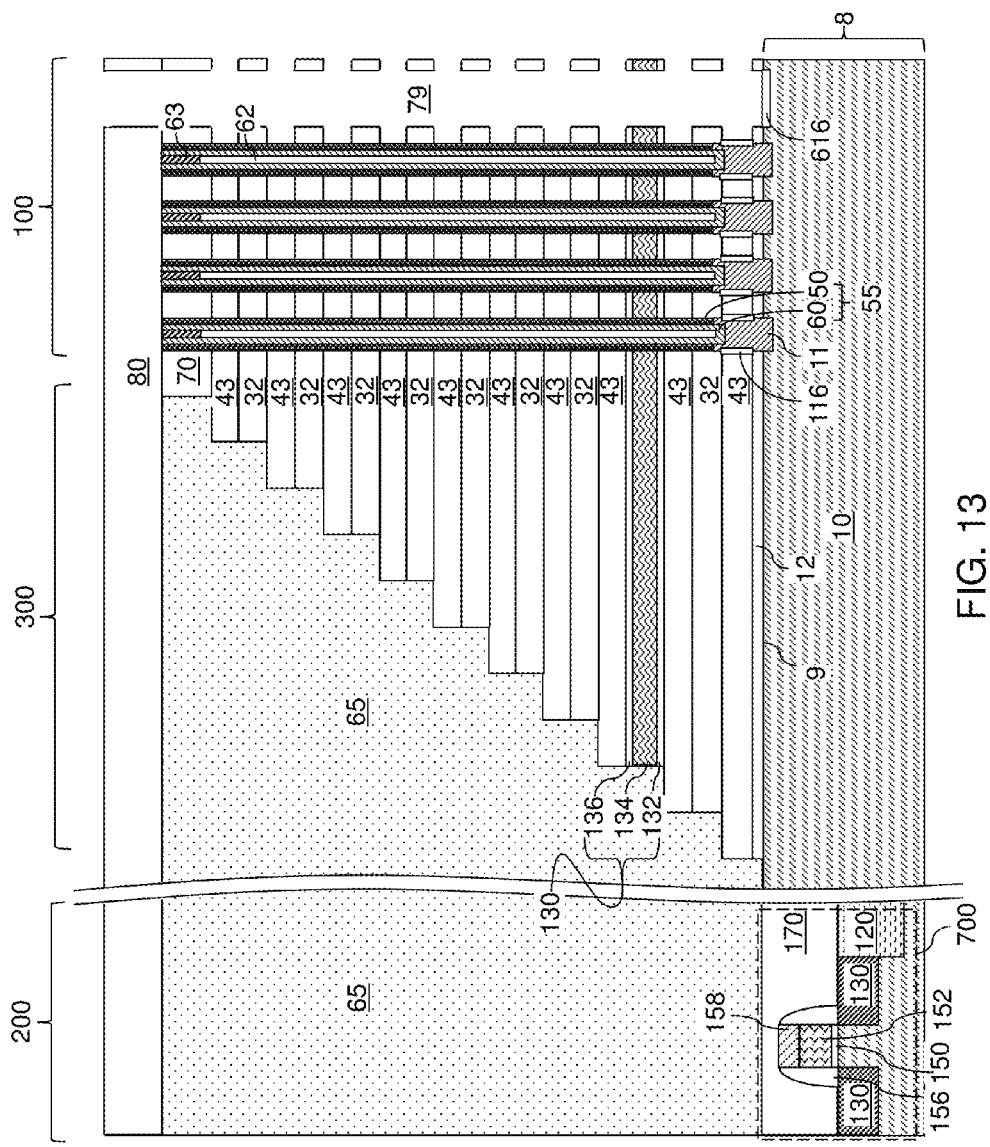
FIG. 13 is a vertical cross-sectional view of the exemplary structure after formation of backside recesses by removal of sacrificial material layers according to an embodiment of the present disclosure.
Figure 14:
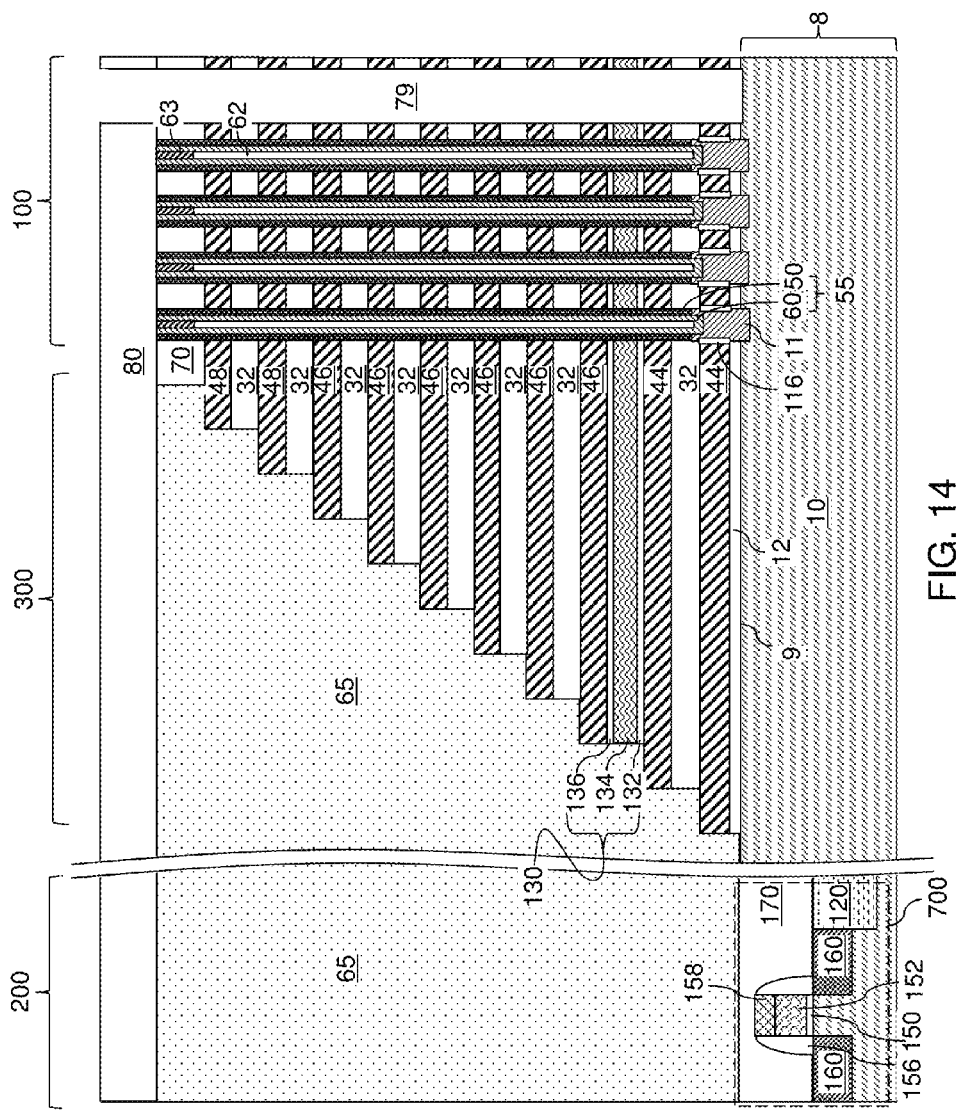
FIG. 14 is a vertical cross-sectional view of the exemplary structure after formation of electrically conductive layers in the backside recesses according to an embodiment of the present disclosure.

Referring to FIG. 13, an etchant that selectively etches the second material of the spacer material layers 42 with respect to the first material of the insulating layers 32 can be introduced into the backside contact trenches 79, for example, employing an etch process. Backside recesses 43 are formed in volumes from which the spacer material layers 42 are removed. The removal of the second material of the spacer material layers 42 can be selective to the first material of the insulating layers 32, the material of the at least one support pillar, the material of the retro-stepped dielectric material portion 65, the material of the gate dielectric layer 12, the materials of the vertically-insulating layer stack 130, and the material of the outermost layer of the memory films 50. In one embodiment, the spacer material layers 42 can include a material selected from silicon nitride, germanium, and a silicon-germanium alloy including germanium at an atomic concentration greater than 40%, and the materials of the insulating layers 32, the at least one dielectric support pillar, the retro-stepped dielectric material portion 65, and the gate dielectric layer 12 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside contact trenches 79. For example, if the spacer material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar, the retro-stepped dielectric material portion 65, and the memory stack structures 55 provide structural support while the backside recesses 43 are present within volumes previously occupied by the spacer material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the spacer material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings.

Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout. Alternatively, the backside recesses 43 may have height variations.

Physically exposed surface portions of the optional epitaxial channel portions 11 can be converted into dielectric material portions by thermal conversion and/or plasma conversion (such as oxidation or nitridation) into dielectric materials. For example, thermal conversion and/or plasma conversion can be employed to convert a surface portion of each epitaxial channel portion 11 into a tubular dielectric spacer 116. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dialectic spacers 116 can include a dielectric oxide, a dielectric nitride, or a dielectric oxynitride of the semiconductor material of the epitaxial channel portions 11. A dielectric semiconductor compound region 616 can be formed on the physically exposed surfaces of the backside contact trenches 79 concurrently with formation of the tubular dielectric spacers 116 by oxidation or nitridation of surface portions of the semiconductor material layer 10.

Optionally, a backside blocking dielectric layer (not shown) can be formed in the backside recesses 43. The backside blocking dielectric layer, if present, comprises a dielectric material that functions as a portion of a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present. The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

At least one metallic material can be deposited in the plurality of backside recesses 43, on the sidewalls of the at least one the backside contact trench 79, and over the top surface of the contact level dielectric layer 80. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers (44, 46, 48) can be formed in the plurality of backside recesses 43, and a continuous metallic material layer can be formed on the sidewalls of each backside contact trench 79 and over the contact level dielectric layer 80. Thus, each spacer material layer 42 can be replaced with an electrically conductive layer (44, 46, 48). A backside cavity is present in the portion of each backside contact trench 79 that is not filled with the backside blocking dielectric layer and the continuous metallic material layer.

In subsequent sections of the present disclosure, the word-line-level electrically conductive layers 46 may be referred to as "electrically conductive layers 46" when identification of the word-line-level electrically conductive layers 46 is clear due to use of the reference numeral 46. The entire set of the at least one lower-select-gate level electrically conductive layer 44, the word-line-level electrically conductive layers 46, and the at least one upper-select-gate level electrically conductive layer 48 may be referred to as the electrically conductive layers (44, 46, 48).

The deposited metallic material of the continuous electrically conductive material layer is etched back from the sidewalls of each backside contact trench 79 and from above the Contact level dielectric layer 80, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the spacer material layers 42 are replaced with the electrically conductive layers (44, 46, 48).

The electrically conductive layers (44, 46, 48) include lower-select-gate-level electrically conductive layers 44 that replace lower-select-gate-level spacer material layers 42L, word-line-level electrically conductive layers 46 that replace the word-line-level spacer material layers 42W, and upper-select-gate-level electrically conductive layers 48 that replace the upper-select-gate-level spacer material layers 42U.

Each lower-select-gate-level electrically conductive layer 44 functions as a source-side select gate electrode. Each upper-select-gate-level electrically conductive layer 48 functions as a drain-side select gate electrode. Each word-line-level electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each word-line-level electrically conductive layer 46 are the control gate electrodes for the vertical memory devices including the memory stack structures 55. In other words, each word-line-level electrically conductive layer 46 can be a word line that functions as a common control gate electrode for the plurality of vertical memory devices.

In one embodiment, the removal of the continuous electrically conductive material layer can be selective to the material of the backside blocking dielectric layer. In this case, a horizontal portion of the backside blocking dielectric layer can be present at the bottom of each backside contact trench 79. In another embodiment, the removal of the continuous electrically conductive material layer may not be selective to the material of the backside blocking dielectric layer or, the backside blocking dielectric layer may not be employed.

Figure 15:
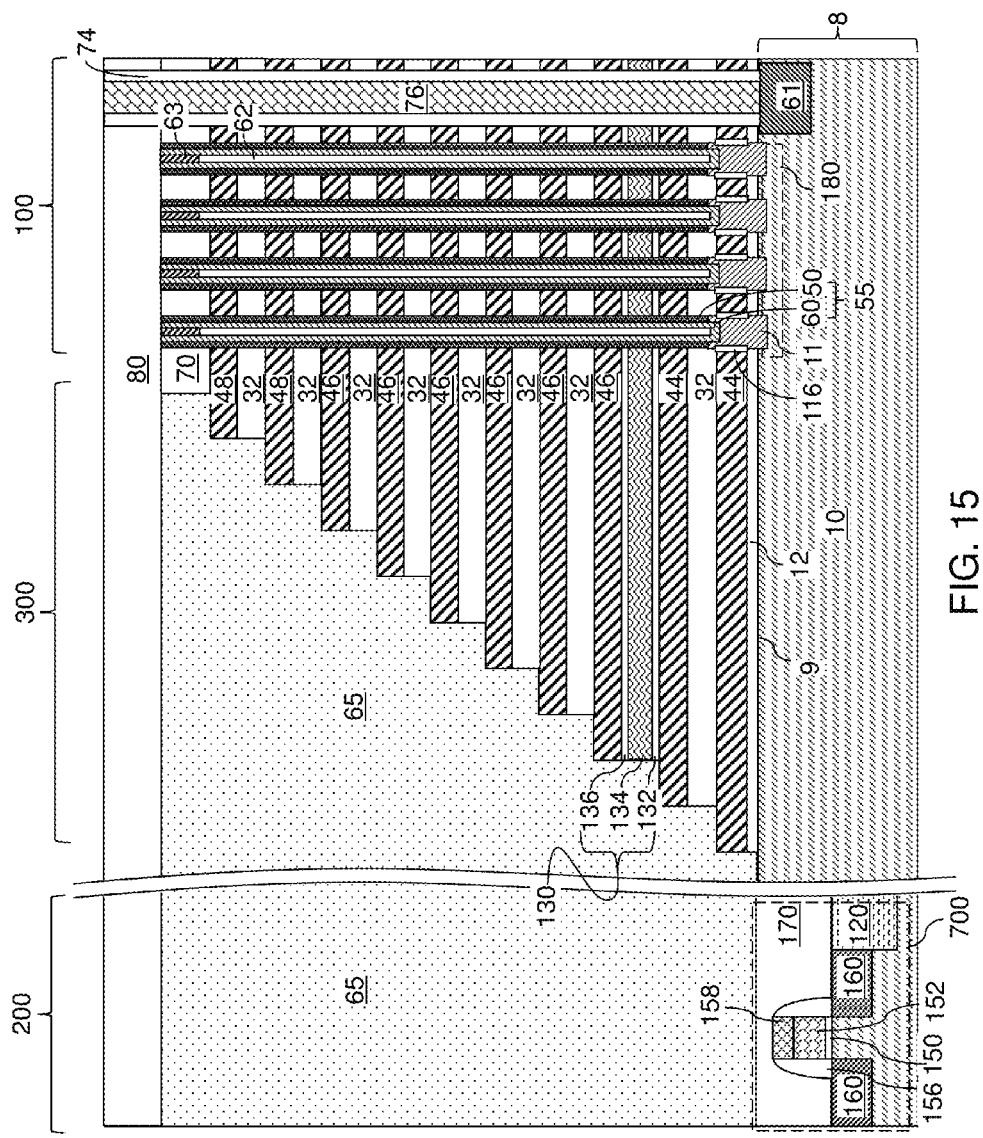
FIG. 15 is a vertical cross-sectional view of the exemplary structure after formation of a source region, an insulating spacer, and a backside contact via structure according to an embodiment of the present disclosure.
Figure 16A:
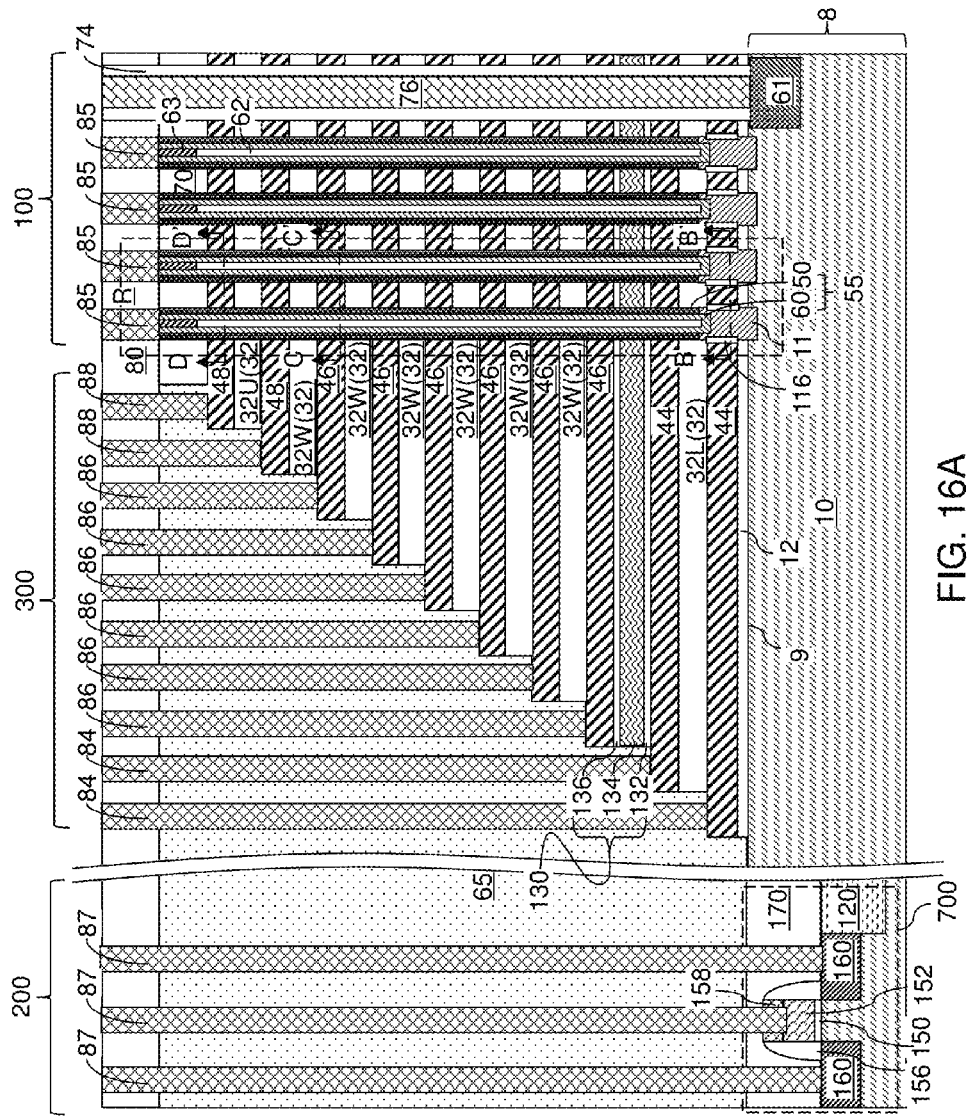
FIG. 16A is a vertical cross-sectional view of the exemplary structure after formation of additional contact via structures according to an embodiment of the present disclosure.
Figure 16D:
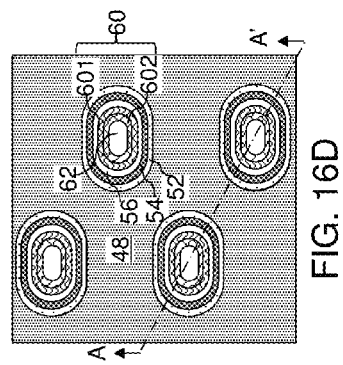
FIG. 16D is a horizontal cross-sectional view of the region R along the horizontal plane D-D' of FIG. 16A.
Figure 16C:
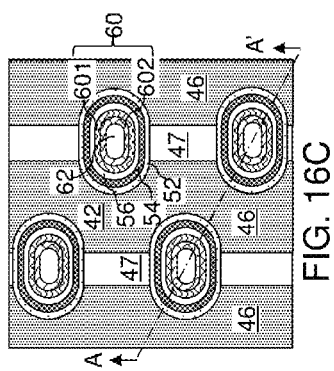
FIG. 16C is a horizontal cross-sectional view of the region R along the horizontal plane C-C' of FIG. 16A.
Figure 16B:
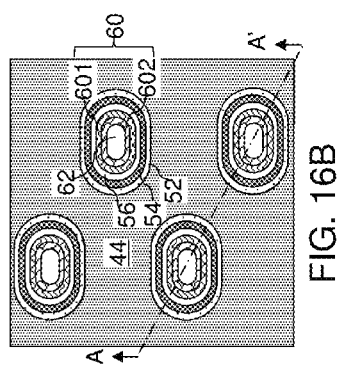
FIG. 16B is a horizontal cross-sectional view of the region R along the horizontal plane B-B' of FIG. 16A.

Referring to FIG. 15, an insulating material layer can be formed in each backside contact trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer is present, the insulating material layer can be formed directly on surfaces of the backside blocking dielectric layer and directly on the sidewalls of the electrically conductive layers (44, 46, 48). If a backside blocking dielectric layer is not employed, the insulating material layer can be formed directly on sidewalls of the insulating layers 32 and directly on sidewalls of the electrically conductive layers (44, 46, 48).

An anisotropic etch is performed to remove horizontal portions of the insulating material layer from above the contact level dielectric layer 80 and at the bottom of each backside contact trench 79. Each remaining portion of the insulating material layer constitutes an insulating spacer 74. A backside cavity is present within a volume surrounded by each insulating spacer 74.

The anisotropic etch process can continue with, or without, a change in the etch chemistry to remove portions of the optional backside blocking dielectric layer and the gate dielectric layer 12 that underlies the opening through the insulating spacer 74. An opening is formed though the gate dielectric layer 12 underneath each backside cavity, thereby vertically extending the backside cavity. A top surface of the semiconductor material layer 10 can be physically exposed at the bottom of each backside contact trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate 8 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 180 for a plurality of field effect transistors. The horizontal semiconductor channel 180 is connected to multiple vertical semiconductor channels 60 through respective epitaxial channel portions 11. The horizontal semiconductor channel 180 contacts the source region 61 and the plurality of epitaxial channel portions 11. The at least one lower-select-gate-level electrically conductive layer 44 provided upon formation of the electrically conductive layers (44, 46, 48) within the entire set of the electrically conductive layers (44, 46, 48) and the insulating layers 32 can comprise a select gate electrode for the field effect transistors.

A contact via structure 76 can be formed within each cavity. Each contact via structure 76 can fill a respective cavity. The contact via structures 76 can be formed by depositing at least one conductive material in the remaining unfilled volume (i.e., the backside cavity) of the backside contact trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the entire set of the electrically conductive layers (44, 46, 48) and the insulating layers 32 as a stopping layer. If chemical mechanical planarization (CMP) process is employed, the contact level dielectric layer 80 can be employed as a CMP stopping layer. Each remaining continuous portion of the at least one conductive material in the backside contact trenches 79 constitutes a backside contact via structure 76. Each contact via structure 76 can be formed directly on a top surface of a source region 61. Each backside contact via structure 76 extends through the entire set of the electrically conductive layers (44, 46, 48) and the insulating layers 32, the vertically-insulating layer stack 130, and an opening in the gate dielectric layer 12, and contacts a top surface of the source region 61.

Referring to FIGS. 16A-16D, additional contact via structures (84, 86, 88, 85, 87) can be formed through the contact level dielectric layer 80, and optionally through the retrostepped dielectric material portion 65. For example, drain contact via structures 85 can be formed through the contact level dielectric layer 80 on each drain region 63. Word line contact via structures 86 can be formed through the word-line-level electrically conductive layers 46 through the contact level dielectric layer 80, and through the retro-stepped dielectric material portion 65. Lower-select-gate-level contact via structures 84 can be formed on the lower-select-gate-level electrically conductive layers 44 through the contact level dielectric layer 80, and through the retrostepped dielectric material portion 65. Upper-select-gate-level contact via structures 88 can be formed on the upper-select-gate-level electrically conductive layers 48 through the contact level dielectric layer 80, and through the retrostepped dielectric material portion 65. Peripheral device contact via structures 87 can be formed through the retrostepped dielectric material portion 65 directly on respective nodes of the peripheral devices.

While an embodiment is illustrated herein in which the spacer material layers are formed as spacer material layers 42 and are subsequently replaced with electrically conductive layers (44, 46, 48), embodiments are expressly contemplated herein in which the spacer material layers are formed as electrically conductive layers (44, 46, 48). In this case, the processing steps employed to form, or fill, lateral recesses can be omitted.

Figure 17:
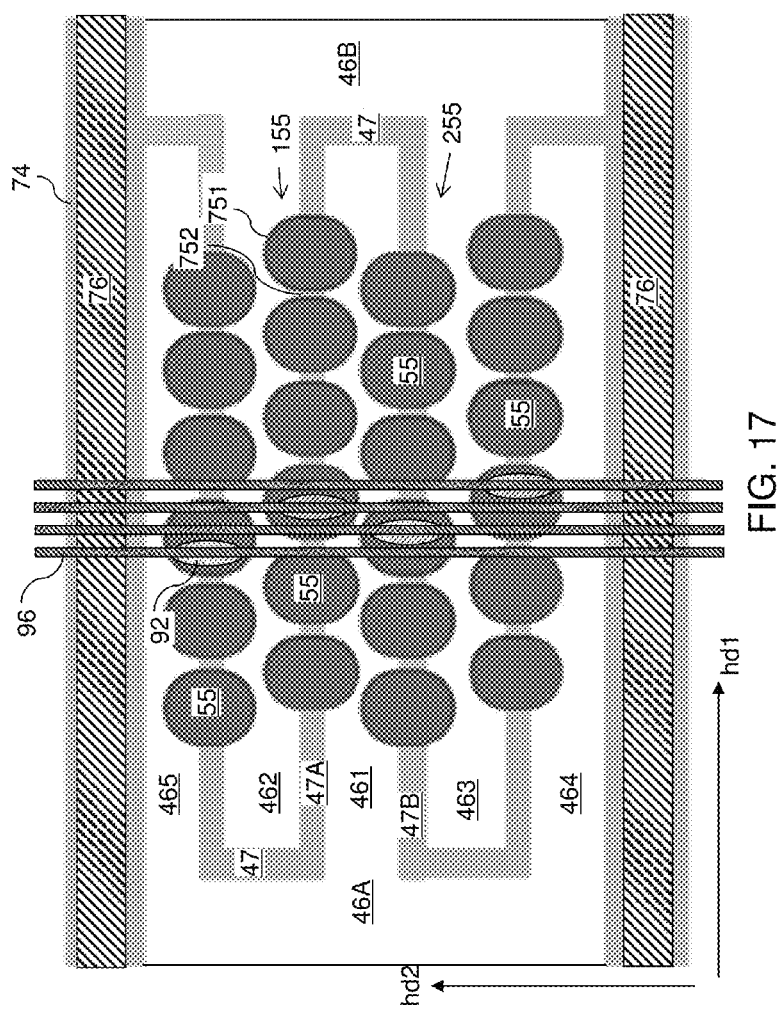
FIG. 17 is a see-through top-down view of the exemplary device structure that illustrates global shapes of various components of the exemplary device structure according to an embodiment of the present disclosure.

FIG. 17 is a see-through top-down view in which material layers overlying a topmost word-line-level electrically conductive layer 46 have been omitted for clarity. Elongated contact via structures 92 that are elongated along the second horizontal direction hd2 can be formed on each drain contact via structure 85 (not shown in FIG. 17, See FIG. 16). While the elongated contact via structures 92 are shown only over four memory stack structures 55 for illustrative purposes, it is understood that the elongated contact via structures 92 can be formed over each memory stack structure 55, e.g., on each drain contact via structure 85. Bit lines 92 extending along the second horizontal direction hd2 can be formed directly on each elongated contact via structure 92. Each drain region 63 is electrically shorted to a respective bit line 92.

A first row 155 and second row 255 of memory stack structures 55 extend through the respective first and second separator insulator structures (47A, 47B). A continuous first control gate electrode 461 extends between the first separator structure 47A and the second separator structure 47B. Control gate electrode 461 is located adjacent to a first (right) side of the first separator structure 47A, adjacent to a first (right) side of the first row 155 of the memory stack structures, adjacent to a first (left) side of the second separator structure 47B, and adjacent to a first (left) side of the second row 255 of the memory stack structures. A second control gate electrode 462 is located adjacent to a second (left) side of the first separator structure 47A, and adjacent to the second (left) side of the first row 155 of the memory stack structures. A third control gate electrode 463 is located adjacent to a second (right) side of the second row 255 of the memory stack structures, and adjacent to a second (right) side of the second separator structure 47B. Electrodes 462 and 463 may comprise finger portions of the same comb shaped word line 46B, while electrode 461 may comprise a finger portion of a different comb shaped word line 46A.

Each electrically conductive layer 46 (i.e., each of the word-line-level electrically conductive layers 46) formed within the alternating stack (32W, 46) includes two physically disjoined portions (46A, 46B) between each neighboring pair of backside trenches (which are filled with the insulating spacers 74 and the backside contact structures 76) that are laterally spaced from each other by a subset of the memory stack structures 55 and portions of the separator insulator structures 47. The two physically disjoined portions (46A, 46B) of each electrically conductive layer 46 comprises two interdigitated electrically conductive portions including multiple fingers (461, 462, 463, 464, 465) that extend along the first horizontal direction hd1. Each of the two interdigitated electrically conductive portions (46A, 46B) includes concave vertical sidewalls 751 that contact respective memory stack structures 55 and are adjoined among one another by planar vertical sidewalls 752 that extend along the first horizontal direction hd1.

Figure 18:
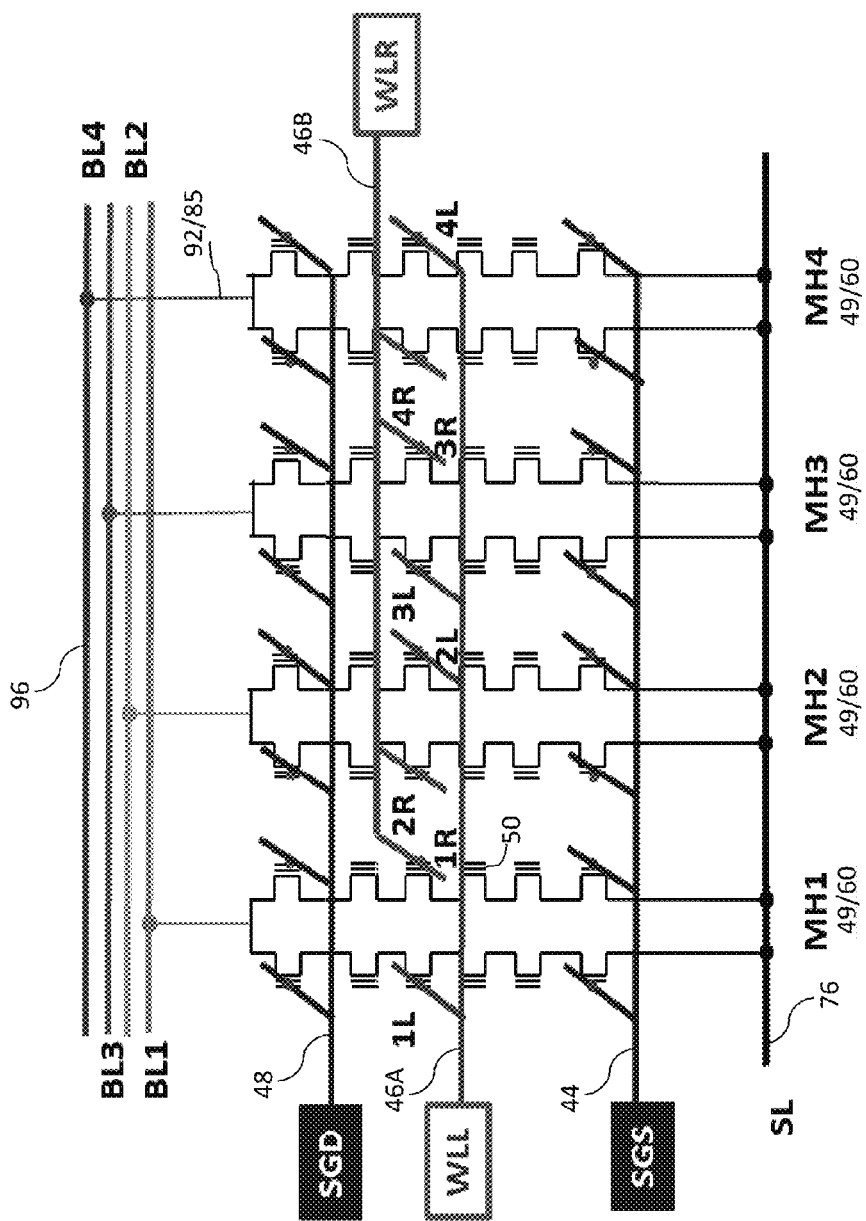
FIG. 18 is a circuit schematic for the array region of the exemplary device structure according to an embodiment of the present disclosure.

Referring to FIG. 18, a circuit schematic is shown, which can be a circuit schematic of the array region of any of the exemplary device structure of the present disclosure. The circuit schematic represents a plurality of NAND strings. Each NAND string comprises a plurality of memory cells. Each memory cell in the NAND string comprises a portion of a first control gate electrode 46A located adjacent to a first portion of a respective memory film 50 of left side memory cells (1L, 2L, 3L, 4L) and a portion of a second control gate electrode 46B which is located adjacent to a second portion of the respective memory film 50 of right side memory cells (1R, 2R, 3R, 4R). The second control gate electrode 46B is electrically insulated from the first control gate electrode 46A.

Each lower-select-gate-level electrically conductive layer 44 is common for two vertical NAND strings that share a same vertical semiconductor channel 60 within each memory opening 49 (MH1, MH2, MH3, MH4). Each upper-select-gate-level electrically conductive layer 48 is common for two vertical NAND strings that share a same vertical semiconductor channel 60 within each memory opening 49 (MH1, MH2, MH3, MH4). Only one of the two control gate electrodes (46A, 46B) is activated during operation of the three-dimensional memory device to ensure that data is written into, or read from, only one vertical NAND string that shares the same vertical semiconductor channel 60. The vertical semiconductor channels 60 are electrically connected to the bit lines 96 through the drain regions and elements 85 and 92.

Referring collectively to FIGS. 12A, 12B, and 16-18, the exemplary structure of the present disclosure can include a three-dimensional memory device. The three-dimensional memory device can include at least one lower-select-gate-level electrically conductive layer 44 located over a substrate 8; at least one etch stop layer, such as a vertically-insulating layer stack 130 located over the at least one lower-select-gate-level electrically conductive layer 44; an alternating stack (32W, 46) of insulating layers 32W and electrically conductive layers 46 located over the vertically-insulating layer stack 130; memory stack structures 55 extending through the alternating stack (32W, 46), the vertically-insulating layer stack 130, and the at least one lower-select-gate-level electrically conductive layer 44; and separator insulator structures 47 vertically extending through the alternating stack (32W, 46) and having respective bottommost surfaces above the at least one lower-select-gate-level electrically conductive layer 44 and contacting sidewalls of the memory stack structures 55 at each level of layers within the alternating stack (32W, 46). Thus, the lower and upper select-gate-level electrically conductive layers (i.e., source side and drain side select gate electrodes) 44 and 48 are not separated by the separator insulator structures 47, while the word lines/control gate electrodes 46 are separated by the separator structures 47.

In one embodiment, the three-dimensional memory device can include backside trenches 79 extending horizontally along a first horizontal direction hd1 and vertically extending through the alternating stack (32W, 46) to a top surface of the substrate 8, wherein each of the alternating stack (32W, 46), the vertically-insulating layer stack 130, and the at least one lower-select-gate-level electrically conductive layer 44 is divided into multiple portions along a second horizontal direction hd2 that is perpendicular to the first horizontal direction hd1 by the backside trenches 79. In one embodiment, a combination of the memory stack structures 55 and the separator insulator structures 47 laterally divide each electrically conductive layer 46 in the alternating stack into two physically disjoined portions (e.g., 46A, 46B) between each neighboring pair of backside trenches 79. In one embodiment, the two physically disjoined portions (46A, 46B) of each electrically conductive layer 46 comprises two interdigitated electrically conductive portions including multiple fingers (461, 462, 463, 463, 466) that extend along the first horizontal direction hd1. In one embodiment, each of the two interdigitated electrically conductive portions (46A, 46B) includes concave vertical sidewalls 751 that contact respective memory stack structures 55 and are adjoined among one another by planar vertical sidewalls 752 that extend along the first horizontal direction hd1.

In one embodiment, the vertically-insulating layer stack 130 can include a lower insulating layer 132 comprising a first insulating material, an etch stop material layer 134 overlying the lower insulating layer 132, and an upper insulating layer 136 comprising a second insulating material. In one embodiment, the first and second insulating materials comprise silicon oxide, and the etch stop material layer comprises a semiconductor material such as amorphous silicon, polysilicon, or a silicon-germanium alloy (which can include silicon at an atomic concentration greater than 80%). In one embodiment, the etch stop material layer 134 can comprise an insulating material (such as a dielectric metal oxide, e.g., aluminum oxide, hafnium oxide, or titanium oxide) or can be electrically floating (by not providing an electrical contact for the etch stop material layer 134 in case the semiconductor material is semiconducting). If layer 134 comprises an insulating material, then layers 132 and 136 may be omitted.

In one embodiment, the three-dimensional memory device can include at least one upper-select-level electrically conductive layer 48 overlying the alternating stack (32W, 46). Topmost surfaces of the separator insulator structures 47 are located below a horizontal plane including a bottom surface of the at least one upper-select-level electrically conductive layer 48. In one embodiment, the separator insulator structures 47 can contact sidewalls of the memory stack structures 55 at each level of layers within the alternating stack (32L, 46).

In one embodiment, the alternating stack (32L, 46) comprises a terrace region in which each electrically conductive layer 46 other than a topmost electrically conductive layer 46 within the alternating stack (32L, 46) laterally extends farther than any overlying electrically conductive layers 46 within the alternating stack (32L, 46), and the terrace region includes stepped surfaces of the alternating stack (32L, 46) that continuously extend from a bottommost layer within the alternating stack (32L, 46) to a topmost layer within the alternating stack (32L, 46).

In one embodiment, the three-dimensional memory device comprises a vertical NAND device located over the substrate 8. The electrically conductive layers 46 comprise, or are electrically connected to, a respective word line of the NAND device. The at least one lower-select-gate-level electrically conductive layer comprises a select gate of the vertical NAND device. The substrate 8 can comprise a silicon substrate. The vertical NAND device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon.

In one embodiment, the array of monolithic three-dimensional NAND strings comprises a plurality of semiconductor channels (180, 11, 60). At least one end portion (e.g., a vertical semiconductor channel 60) of each of the plurality of semiconductor channels (180, 11, 60) extends substantially perpendicular to a top surface of the substrate 8. The array of monolithic three-dimensional NAND strings comprises a plurality of charge storage elements (as embodied as portions of the memory material layer 54 located at each level of the electrically conductive layers 46), each charge storage element located adjacent to a respective one of the plurality of semiconductor channels. The array of monolithic three-dimensional NAND strings comprises a plurality of control gate electrodes (as embodied as portions of the electrically conductive layers 46) having a strip shape extending substantially parallel to the top surface of the substrate 8. The plurality of control gate electrodes comprise at least a first control gate electrode located in a first device level and a second control gate electrode located in a second device level.

Thus, in embodiments of the present disclosure at least one lower-select-gate-level electrically conductive layer 44 and/or at least one upper-select-level electrically conductive layer 48 without a split memory cell configuration can be provided by limiting the levels of separator insulator structures 47 within the levels of the word lines 46. The select gate electrodes 44, 48 can control the entire semiconductor channel layer 60 within each memory opening 49. The embodiments of the present disclosure have the following non-limiting advantages. By not separating the source side and drain side select gate electrodes (44, 48) by the separator insulator structures 47, reduces threshold voltage variability due to structural variability of the trench that is filled with the separator insulator structures 47. This improves inhibit characteristics due to the tighter threshold voltage distribution and higher number of multi-level cells and their performance characteristics. Further, less threshold voltage variability leads to a lower boost leakage and lower $V_{cc}$ to decrease the power consumption of the device. Furthermore, gate to gate short circuits are reduced or eliminated.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
at least one lower-select-gate-level electrically conductive layer located over a substrate;
a at least one etch stop layer located over the at least one lower-select-gate-level electrically conductive layer;
an alternating stack of insulating layers and electrically conductive layers located over the at least one etch stop layer;
memory stack structures extending through the alternating stack, the at least one etch stop layer, and the at least one lower-select-gate-level electrically conductive layer;
separator insulator structures vertically extending through the alternating stack and having respective bottommost surfaces above the at least one lower-select-gate-level electrically conductive layer and contacting sidewalls of the memory stack structures at each level of layers within the alternating stack; and
at least one upper-select-level electrically conductive layer overlying the alternating stack, wherein topmost surfaces of the separator insulator structures are located below a horizontal plane including a bottom surface of the at least one upper-select-level electrically conductive layer.

2. The three-dimensional memory device of claim 1, further comprising backside trenches extending horizontally along a horizontal direction and vertically extending through the alternating stack to a top surface of the substrate, wherein each of the alternating stack, the at least one etch stop layer, and the at least one lower-select-gate-level electrically conductive layer is divided into multiple portions along a second horizontal direction that is perpendicular to the first horizontal direction by the backside trenches.

3. The three-dimensional memory device of claim 2, wherein a combination of the memory stack structures and the separator insulator structures laterally divide each electrically conductive layer in the alternating stack into two physically disjoined portions between each neighboring pair of backside trenches.

4. The three-dimensional memory device of claim 3, wherein the two physically disjoined portions of each electrically conductive layer comprises two interdigitated electrically conductive portions including multiple fingers that extend along the first horizontal direction.

5. The three-dimensional memory device of claim 4, wherein each of the two interdigitated electrically conductive portions includes concave vertical sidewalls that contact respective memory stack structures and are adjoined among one another by planar vertical sidewalls that extend along the first horizontal direction.

6. The three-dimensional memory device of claim 1, wherein the at least one etch stop layer comprises a vertically-insulating layer stack which comprises:
a lower insulating layer comprising a first insulating material;
an etch stop material layer overlying the lower insulating layer; and
an upper insulating layer comprising a second insulating material.

7. The three-dimensional memory device of claim 6, wherein:
the at least one lower-select-gate-level electrically conductive layer comprises a select gate electrode of a NAND memory device;
the electrically conductive layers comprise control gate electrodes of the NAND memory device;
the separator insulator structures separate the control gate electrodes but not the select gate electrode;
the first and second insulating materials comprise silicon oxide; and
the etch stop material layer comprises a semiconductor material.

8. The three-dimensional memory device of claim 6, wherein the etch stop material layer comprises an insulating material or is electrically floating.

9. The three-dimensional memory device of claim 1, wherein the separator insulator structures contact sidewalls of the memory stack structures at each level of layers within the alternating stack.

10. The three-dimensional memory device of claim 1, wherein the alternating stack comprises a terrace region in which each electrically conductive layer other than a topmost electrically conductive layer within the alternating stack laterally extends farther than any overlying electrically conductive layers within the alternating stack, and the terrace region includes stepped surfaces of the alternating stack that continuously extend from a bottommost layer within the alternating stack to a topmost layer within the alternating stack.

11. The three-dimensional memory device of claim 1, wherein:
the three-dimensional memory device comprises a vertical NAND device located over the substrate;
the electrically conductive layers comprise, or are electrically connected to, a respective word line of the NAND device;
the at least one lower-select-gate-level electrically conductive layer comprises a select gate of the vertical NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in a first device level and a second control gate electrode located in a second device level.

12. A three-dimensional memory device comprising:
at least one lower-select-gate-level electrically conductive layer located over a substrate;
a at least one etch stop layer located over the at least one lower-select-gate-level electrically conductive layer;
an alternating stack of insulating layers and electrically conductive layers located over the at least one etch stop layer;
memory stack structures extending through the alternating stack, the at least one etch stop layer, and the at least one lower-select-gate-level electrically conductive layer;
separator insulator structures vertically extending through the alternating stack and having respective bottommost surfaces above the at least one lower-select-gate-level electrically conductive layer and contacting sidewalls of the memory stack structures at each level of layers within the alternating stack; and
backside trenches extending horizontally along a horizontal direction and vertically extending through the alternating stack to a top surface of the substrate, wherein each of the alternating stack, the at least one etch stop layer, and the at least one lower-select-gate-level electrically conductive layer is divided into multiple portions along a second horizontal direction that is perpendicular to the first horizontal direction by the backside trenches.

13. The three-dimensional memory device of claim 12, wherein a combination of the memory stack structures and the separator insulator structures laterally divide each electrically conductive layer in the alternating stack into two physically disjoined portions between each neighboring pair of backside trenches.

14. The three-dimensional memory device of claim 13, wherein the two physically disjoined portions of each electrically conductive layer comprises two interdigitated electrically conductive portions including multiple fingers that extend along the first horizontal direction.

15. The three-dimensional memory device of claim 14, wherein each of the two interdigitated electrically conductive portions includes concave vertical sidewalls that contact respective memory stack structures and are adjoined among one another by planar vertical sidewalls that extend along the first horizontal direction.

16. The three-dimensional memory device of claim 12, wherein the at least one etch stop layer comprises a vertically-insulating layer stack which comprises:
a lower insulating layer comprising a first insulating material;
an etch stop material layer overlying the lower insulating layer; and
an upper insulating layer comprising a second insulating material.

17. The three-dimensional memory device of claim 12, further comprising at least one upper-select-level electrically conductive layer overlying the alternating stack, wherein topmost surfaces of the separator insulator structures are located below a horizontal plane including a bottom surface of the at least one upper-select-level electrically conductive layer, wherein the separator insulator structures contact sidewalls of the memory stack structures at each level of layers within the alternating stack.

18. A three-dimensional memory device comprising:
at least one lower-select-gate-level electrically conductive layer located over a substrate;
at least one etch stop layer located over the at least one lower-select-gate-level electrically conductive layer;
an alternating stack of insulating layers and electrically conductive layers located over the at least one etch stop layer;
memory stack structures extending through the alternating stack, the at least one etch stop layer, and the at least one lower-select-gate-level electrically conductive layer; and
separator insulator structures vertically extending through the alternating stack and having respective bottommost surfaces above the at least one lower-select-gate-level electrically conductive layer and contacting sidewalls of the memory stack structures at each level of layers within the alternating stack,
wherein the at least one etch stop layer comprises a vertically-insulating layer stack which comprises:
a lower insulating layer comprising a first insulating material;
an etch stop material layer overlying the lower insulating layer; and
an upper insulating layer comprising a second insulating material.

19. The three-dimensional memory device of claim 18, wherein:
the at least one lower-select-gate-level electrically conductive layer comprises a select gate electrode of a NAND memory device;
the electrically conductive layers comprise control gate electrodes of the NAND memory device;
the separator insulator structures separate the control gate electrodes but not the select gate electrode;
the first and second insulating materials comprise silicon oxide; and
the etch stop material layer comprises a semiconductor material.

20. The three-dimensional memory device of claim 18, wherein the etch stop material layer comprises an insulating material or is electrically floating.

21. The three-dimensional memory device of claim 18, further comprising backside trenches extending horizontally along a horizontal direction and vertically extending through the alternating stack to a top surface of the substrate, wherein each of the alternating stack, the at least one etch stop layer, and the at least one lower-select-gate-level electrically conductive layer is divided into multiple portions along a second horizontal direction that is perpendicular to the first horizontal direction by the backside trenches.

22. The three-dimensional memory device of claim 18, further comprising at least one upper-select-level electrically conductive layer overlying the alternating stack, wherein topmost surfaces of the separator insulator structures are located below a horizontal plane including a bottom surface of the at least one upper-select-level electrically conductive layer,
wherein the alternating stack comprises a terrace region in which each electrically conductive layer other than a topmost electrically conductive layer within the alternating stack laterally extends farther than any overlying electrically conductive layers within the alternating stack, and the terrace region includes stepped surfaces of the alternating stack that continuously extend from a bottommost layer within the alternating stack to a topmost layer within the alternating stack.

* * * * *